(12) United States Patent
Thomsen et al.

(10) Patent No.: US 7,928,876 B2
(45) Date of Patent: Apr. 19, 2011

(54) SIGMA DELTA MODULATOR

(75) Inventors: Henrik Thomsen, Holte (DK); Claus Erdmann Fuerst, Roskilde (DK)

(73) Assignee: Audioasics A/S, Roskilde (DK)

( * ) Notice: Subject to any disclaimer, the term of this patent is extended or adjusted under 35 U.S.C. 154(b) by 523 days.

(21) Appl. No.: 10/599,343

(22) PCT Filed: Apr. 11, 2005

(86) PCT No.: PCT/DK2005/000247
§ 371 (c)(1),
(2), (4) Date: Sep. 29, 2008

(87) PCT Pub. No.: WO2005/099098
PCT Pub. Date: Oct. 20, 2005

(65) Prior Publication Data
US 2009/0066549 A1   Mar. 12, 2009

Related U.S. Application Data

(60) Provisional application No. 60/560,612, filed on Apr. 9, 2004.

(51) Int. Cl.
*H03M 3/00* (2006.01)
(52) U.S. Cl. ........................ 341/143; 375/247
(58) Field of Classification Search .......... 341/143, 341/155, 144; 375/247, 245
See application file for complete search history.

(56) References Cited

U.S. PATENT DOCUMENTS

| | | | |
|---|---|---|---|
| 3,931,596 A | | 1/1976 | Gersho et al. |
| 4,839,657 A | * | 6/1989 | Chikhani et al. ............. 342/190 |
| 5,534,827 A | * | 7/1996 | Yamaji ........................ 332/103 |
| 6,642,874 B1 | | 11/2003 | Lin et al. |
| 6,795,004 B2 | * | 9/2004 | Masuda et al. ................ 341/143 |
| 7,116,721 B1 | * | 10/2006 | Melanson et al. ............ 375/247 |
| 2002/0030618 A1 | | 3/2002 | Cusinato et al. |
| 2003/0012393 A1 | * | 1/2003 | Armstrong .................... 381/321 |
| 2003/0067404 A1 | | 6/2003 | Ruha et al. |
| 2003/0223592 A1 | * | 12/2003 | Deruginsky et al. ............ 381/92 |
| 2003/0227401 A1 | * | 12/2003 | Yang et al. .................... 341/143 |

OTHER PUBLICATIONS

Jie, Yu, "Design and Analysis of Fixed and Adaptive Sigma-Delta Modulators." Ph.D. Thesis, Dept. of Electrical Engineering, King's College, University of London, Sep. 1992, p. 1-208.

Aldajani, M.A. et al., "An adaptve structure for sigma delta modulation with improved dynamic range." Circuits and Systems. 2000. Proceedings of the 43rd IEEE Midwest Symposium on Aug. 8-11, 2000, Piscataway, NJ, USA. IEEE Aug. 8, 2000, pp. 390-394.

Yu, J et al., "Adaptive Quantisation of One-Bit Sigma-Delta Modulation." IEEE Procedings G. Electronic Circuits and Systems, Institution of Eletrical Engineers, Stevenage, GB. vol. 139, No. 1, Feb. 1, 1992, pp. 39-44.

Dunn and Sandler, Adaptive sigma-delta modulation for use in DACs, Electronics Letters, May 9, 1996, vol. 32, No. 10, pp. 867-868.

* cited by examiner

*Primary Examiner* — Joseph Lauture
(74) *Attorney, Agent, or Firm* — Kenyon & Kenyon LLP

(57) ABSTRACT

A method of controlling a sigma delta modulator with a loop which establishes a signal transfer function, STF, and a quantization noise transfer function, NTF, of the sigma delta modulator, wherein the sigma delta modulator receives an input signal, x(n), and provides a modulated output signal, y(n) in response to the input signal. The method is characterized in comprising the step of controlling the sigma delta modulator to change the quantization noise transfer function, NTF, in response to a signal feature, A(n), which is correlated with the input signal.

33 Claims, 21 Drawing Sheets

SIGMA DELTA MODULATOR

CROSS REFERENCE TO PRIOR APPLICATION

The above referenced application is a National Phase of International Patent Application No. PCT/DK2005/000247, filed Apr. 11, 2005, which claims priority from U.S. Provisional Application No. 60/560,612, filed Apr. 9, 2004, which is incorporated by reference herein. The International application was published in English on Oct. 20, 2005 as WO 2005/099098 A1.

FIELD OF THE INVENTION

The present invention relates to a sigma delta modulator.

BACKGROUND

In recent years sigma delta converters of the low-pass type have been used successfully in A/D or D/A converters, but they are also used in different types of Class-D amplifiers. Further, band-pass sigma delta converters have been used successfully for frequency up/down modulation in combination with digital or analogue conversion of RF base-band signals used in digital wireless communications system.

Conventional converters are build around a quantizer with a relatively fine resolution typically specified by the number of bits with which the signal is represented e.g. 8 bits, 12 bits or 16 bits. However, due to the fine resolution quantizer they are relatively complex in structure compared to the sigma delta converter. Further improvements of the conventional converter are cumbersome in that, on the one hand, further improvements of the fine resolution of the conventional converters will cause a dramatic increase in the complexity of the converter. Additionally, expensive matching or trimming of components is required. On the other hand, an increased sampling frequency will in general add extra costs to the manufacture of the converter. Conventional converters sample an input signal at the Nyquest frequency, however, over-sampling of typically two to 16 times may be applied.

Sigma delta converters are less complex in their basic structure than the conventional converters. They are built around a quantizer with a relatively coarse resolution of typically 2, 3 or 4 levels of the full scale input signal. This low resolution quantizer can be operated at a greater sampling frequency than the fine resolution quantizer, but at the cost of a larger quantization error i.e. the difference between the input signal and the output signal.

To compensate for the larger quantization error, the sigma delta modulator is configured with a feedback loop where the integral of the quantization error modulates the quantizer. Further, the sigma delta modulator operates with relatively high over-sampling ratios of e.g. 32, 50, 64 or 128 times. The signal to the sigma delta modulator is typically sampled at the over-sampled sampling frequency which is also denoted the clock frequency of the sigma delta modulator. The sigma delta modulator operates at this clock frequency equal to the over-sampling ratio multiplied by the sampling frequency. By means of the configuration and the high clock frequency the quantization error is integrated at the relatively high clock frequency, typically multitudes above the Nyquest frequency, to provide a signal which in average, across a Nyquest sampling time interval, has almost no error. A typical clock frequency for audio band signal processing is e.g. 1.2 MHz or 2.4 MHz.

A bit stream at the greater sampling frequency is generated. Since typically it is inconvenient to perform subsequent signal processing at the greater sampling frequency, a decimation process is applied to the bit stream whereby a digital output signal at a rate of about the Nyquest frequency and with a desired relatively fine resolution is provided. Generally, the sigma delta modulator provides lower distortion and lower cost when compared to conventional converters.

FIG. 1 shows a model of a generic sigma delta modulator. The sigma delta modulator is shown in a discrete time domain (Z-domain) implementation where $x(n)$ and $y(n)$ are an input signal and an output signal, respectively, with signal values at discrete time instances n. The modulator comprises an input filter, $G(z)$, a quantizer, Q, a loop filter, $H(z)$, and an adder, S1, which calculates the sum of values input to it according to the shown signs i.e. values from $H(z)$ is subtracted from values from $G(z)$. It should be noted that other equivalent configurations exist e.g. where $H(z)$ is arranged between the adder and quantizer or where $H(z)$ is partitioned with an a-part between the adder and the quantizer and a b-part in the feedback loop.

For a low-pass sigma delta modulator, the feed-back loop of the sigma delta converter acts as an integrator, which in combination with the adder S1 ensures that the quantization error in average is zero or close to zero. The sigma delta modulator acts as a low-pass filter for an input signal and as a high-pass filter for the quantization noise. This is an expedient behaviour in that, when the loop filter is designed to pass input signals in a band of interest, quantization noise is attenuated in that band of interest band.

The noise attenuation is appreciable even with a first-order sigma delta modulator, that is, a modulator comprising a single integrator stage upstream of the quantizer, but to achieve the required high signal/noise ratios of high resolution converters, it is necessary to use higher-order modulators, that is, modulators comprising several integrators in cascade. However, if a higher-order modulator is used, stability problems arise.

In the design of the sigma delta converter it is an objective to minimize the quantization noise in the pass-band produced by the quantizer Q, i.e. to modulate the quantization noise. Further it is a objective to maximize the signal swing of the modulator output in the signal band of interest or the filtered modulator output signal (usually called MSA) and the goal is to achieve an MSA as close to one 1.0. The MSA is especially important for modulators with 2, 3, 4 levels quantizer $Q(z)$ (or low levels quantizer), since the normal S-domain/Z domain stability criterions do not apply for this highly nonlinear system.

Both of these objectives will maximize the dynamic range of the modulator and the last objective are especially useful in Class D converters and in low voltage implementation of the modulator. A Third objective is to minimize the die size, which will reduce cost and power consumption of the modulator in an ASIC implementation.

In order to reach the third objective of minimizing the power/die size in an ASIC design of the modulator it is crucial to use 1 bit or low number quantization levels. Low number of levels in the quantizer of the modulators generates more quantization noise in order to attenuate the quantization noise in the signal band it is necessary to use high order and very aggressive feedback loops filters $H(z)$ with a Noise Transfer function (see definition later) that has a very steep transition between stop/pass band and high attenuation in the stop-band. Again, a high order aggressive feedback loop filter will lower the MSA. If the MSA is very low, the Noise Transfer Function of the modulator would have a very good attenuation of the quantization noise, but since the MSA is low it will jeopardize the dynamic range and full scale signal swing. In order to optimize the dynamic range/SNR of the modulator there exists an optimum choice of MSA.

Unfortunately these above three objectives are partly conflicting, and a compromise has to be made i.e. a trade off exists between minimizing the quantization noise (in the pass-band) and obtaining high MSA and so on. Usually the optimum, taking all three objective into consideration, ends up with an MSA around 0.5 (or 6 dB below full-scale). See for example the DSD1702 data sheet from Texas Instruments where a sigma delta modulator is used in a D/A converter.

PRIOR ART

US 2002/0030618-A1 discloses a method of re-establishing the stability of a sigma delta modulator with a plurality of integrator stages in cascade and a quantizer. The digital output from the modulator is monitored to detect a predefined bit-sequence corresponding to an instability state of the modulator. If and when the bit-sequence is detected a last of the integrators in the cascade is reset and one or more preceding integrator states are reset, progressively, until the instability state is no longer detected.

Thereby, likely stability problems in a higher order sigma delta modulator are resolved by detecting an indication of lack of stability and bringing the modulator back to a stable state to revive performance of the sigma delta modulator. However, a modulator according to such prior art will suffer from a dominant or relatively high Total Harmonic Distortion, THD, due to abrupt or highly non-linear control of the sigma delta modulator.

U.S. Pat. No. 6,642,874 B1 discloses a method of shaping the quantization noise without affecting the band of interest. This is implemented by means of a further feedback loop which provides an additional error feedback path via a filter, $R(z)$. The filter $R(z)$ shapes the quantization noise in the band of interest without further affecting the modulators response in the band of interest to the input signal. Thereby, the dynamic range (or SNR) of a modulator is extendable by proper design of $R(z)$.

Proper design of $R(z)$ will improve the dynamic range of the modulator, but the modulator will only improve the signal-to-noise ratio for modulators which are stable. Thus the disclosed method will not ensure that a stable higher order modulator with a low-level quantizer is provided. Therefore, the disclosed modulator requires a relatively complex configuration with quantization levels above about 5 or 6 levels for higher order modulators.

Thus, the prior art does not provide a solution to the conflict between the three objectives mentioned above. Such a solution would be highly relevant and appreciated. That is, a method that enables further attenuation of the quantization noise while preserving a high MSA, but without having to make the usually tradeoffs and compromises.

SUMMARY OF THE INVENTION

There is provided a method of controlling a sigma delta modulator with a loop which establishes a signal transfer function, STF, and a quantization noise transfer function, NTF, of the sigma delta modulator, the sigma delta modulator receives an input signal and provides a modulated output signal, in response to the input signal. The method comprises the step of controlling the sigma delta modulator to change the quantization noise transfer function, NTF, in response to a signal feature which is correlated with the input signal.

Since adaptive noise shaping is applied, the maximum stable amplitude, MSA, is adapted to the present signal amplitude to thereby attenuate the quantization noise as far as possible, while maintaining stability of the modulator. Consequently, the signal-to-noise ratio is improved. That is, the quantization noise is shaped in dependence of the signal amplitude. In other words, the noise transfer function is adapted to the input signal.

In general, it is experienced that MSA depends (monotonically) on the numerical value of the integral of the noise transfer function. Therefore, different ways of changing the NTF are possible to achieve a desired change of MSA.

It should be noted that it is understood that the signal feature is correlated with the amplitude of the input signal. As it is described in the following, it is understood that the signal feature can be provided by different signal sources of a sigma delta modulator and/or by different signal processing of the different signal sources. Thus it is clear that different degrees of correlation can provide sufficient information for controlling the noise transfer function.

Different implementations of the control method and the sigma delta modulator can be provided. Such implementations can comprise analogue, software, and/or digital implementations.

Preferably, the noise transfer function, NTF, is changed to suppress quantization noise to a smaller extent when the signal feature, $A(n)$, represents a relatively large amplitude, relative to when the signal feature, $A(n)$, represents a relatively small amplitude, the noise transfer function is changed to suppress quantization noise to a larger extent. This is an expedient control or adaptation strategy since when the integral below NTF is increased, MSA is increased. However, on the first hand, more quantization noise will be generated in a signal band or band of interest when MSA is increased. On the other hand, a small MSA value is a limitation to signal swing (assuming stability is required).

When the noise transfer function, NTF, is changed while the sigma delta modulator operates in a stable state, the above improvements of the signal-to-noise ratio is not ruined by an increase of distortion caused by the control of the sigma delta modulator. Thus, less distortion is obtained since the modulator will be very reluctant to show oscillating or 'run-away' components in its output signal.

A sigma delta loop comprising a loop filter, $H(z)$, with a cascade of more than two integrators is particular useful in combination with the control method.

It is known that a sigma delta modulator comprises a quantizer and that for two-level quantizers a first order loop filter always provides a stable modulator, whereas second order loop filters are conditionally stable. Higher order loop filters provide better noise attenuation by means of more aggressive filters, but they are potentially unstable. Therefore the control method is especially expedient in combination with higher order modulators.

The method is further expedient for quantizers with low number of quantization levels since such quantizers are highly non-linear.

The sigma delta loop comprises a loop filter, and shaping of the noise transfer function is controlled by changing filter coefficients of a loop filter to move zeroes or poles in the transfer function provided by the loop filter. Moving poles and zeroes of the transfer function is one option for controlling MSA, since the numerical value of the integral of the noise transfer function can be changed by moving poles and/or zeroes. For typical cascaded integrator filters it is well-known that locations of poles and zeroes are controlled by changing b-coefficients or a- and/or e-coefficients (complex poles and zeroes). Other ways of controlling poles and zeroes exist for other types of loop filters.

Preferably, however, the loop filter comprises a cascade of integrator stages, and shaping of the noise transfer function is controlled by changing loss-coefficients of the integrators. Thereby, the slope of the NTF is changeable, this in turn will change the area under the NTF curve.

Expediently, the loss-coefficients of the integrators are controllably adjustable between a lower value, larger than the value zero and an upper value lower than or equal to one. The loss-coefficients are gradually adjustable by selecting discrete pre-computed values or by computing incrementally changes of the loss-coefficients. It is experienced that the losses are preferably applied with values increasing from a first to a subsequent integrator in the cascade. Integrator losses corresponding to integrator feedback coefficients from e.g. 0.5 to 0.8 or 1.0 are typical values. It should be noted that the losses can be applied in different combinations.

In a preferred embodiment, the sigma delta loop comprises a quantizer which quantizes an input to the quantizer in $N_Q$ levels, where $N_Q$ is larger than or equal to two levels, but less than six levels. As stated above, the control method is expediently suitable for quantizers with low number of quantization levels since such quantizers are highly non-linear. Especially in combination with higher order loop filters better noise attenuation can be obtained by means of more aggressive filters, but they are potentially unstable. Expedient embodiments comprise a two-level quantizer with a fourth order loop filter, a three-level quantizer with a fourth order loop filter, or three-level quantizer with a fifth order loop filter.

In an aspect of the method, the sigma delta loop comprises a quantizer, and shaping of the noise transfer function is controlled by changing thresholds of a quantizer of the loop. The thresholds will change the signal processing behaviour of the quantizer, and this in turn will provide more freedom in changing the noise transfer function. This is obtained since the number of quantizer levels and location of threshold values of the quantizer determines the connection between MSA and quantization error gain which in turn is connected to the noise transfer function as determined by the loop filter. This is described in connection with FIGS. 5 and 6.

In another aspect the input signal is provided via a pre-filter which is controlled for selected values of the signal feature. Thereby equalization of the input signal is possible e.g. when the signal transfer function reduces the signal band.

In a further aspect the method comprises the step of: computing connected values of threshold peak values and selectable loop filter parameters, which are connected in the sense that for a given value of the signal feature, $A(n)$, a nearest lower threshold peak value determines the threshold at which selectable loop filter parameters, when applied to the loop filter, provide a modulator which is stable for values of the signal feature.

The signal feature can be the input signal of the modulator, and/or the output signal from the modulator and/or a state variable of the loop filter. These signals are correlated with the input signal at least to an extent where sufficient control of the noise transfer function can be provided.

Preferably, the signal feature is processed by a peak detector to provide an intermediate control signal based on which a decision on which control signals to provide for control of the noise transfer function is performed. A peak detector is expedient since the risk of exceeding MSA is thereby reduced.

Preferably, the peak detector performs low-pass filtering of the signal feature and subsequently determines the numerical value of the low-pass filtered signal feature. This is particular expedient when the signal feature is noisy e.g. when the signal feature is the output signal of the modulator or especially when the signal feature is a state variable of the loop filter.

Preferably, a running window of N previous samples of the output provided by the peak detector is stored, and a maximum of the N previous samples is selected as the intermediate control signal. For instance N=10 or N is larger, but less than a number of samples corresponding to the over-sampling ratio, OSR. Typically, OSR is 32, 50, 64 or other ratios.

Preferably, the decision on which control signals to provide for control of the noise transfer function is performed by a lookup table which comprises stored control signals and associated with values or ranges of values of the intermediate control signal $\hat{x}_n$. For analogue implementations the lookup table e.g. stores control bits for selecting switch-cap coefficients. For digital implementations digital coefficients can be stored directly in the lookup table.

The noise transfer functions can, by selection, provide a maximum stable amplitude, MSA, located at least approximately 5% above an estimated peak. Thereby a certain safety margin in provided. A safety margin is desirable since the estimate is typically noisy and since the low-pass filter introduces a delay.

A full-scale range of peak values of the signal feature is divided into a number of ranges, where each range is associated with a selectable noise transfer function. Two or three adaptation levels may be preferred, but any number of adaptation levels is possible. Expediently, a top range of adaptation signal values is divided into more adaptation levels than a middle range. Additionally or alternatively, a low range of adaptation levels is divided into more levels than middle range.

In an aspect of the method the following steps are performed: determining minimum values (Amin) of a noise amplification factor, A, for different loop filters; determining a maximum stable amplitude value, MSA, which is selected such that input signal values less than MSA will provide a stable modulator; creating a bank of different loop filters wherein each filter is related to a respective determined maximum amplitude value MSA; and selecting a filter from the bank in response to an adaptation signal which is correlated with the input signal.

Moreover, there is provided a computer program and a computer readable medium encoded with a program which when run by a computer performs the method.

Still moreover, there is provided an analogue to digital converter, a digital to analogue converter, a microphone and a class-D amplifier comprising a sigma delta modulator controlled in accordance with the above method.

BRIEF DESCRIPTION OF THE DRAWING

The invention will be described in connection with the drawing in which.

DETAILED DESCRIPTION

As an introduction to the description of preferred embodiments, a simple sigma delta modulator with a linearized quantizer is described with respect to stability considerations.

Figure 1:
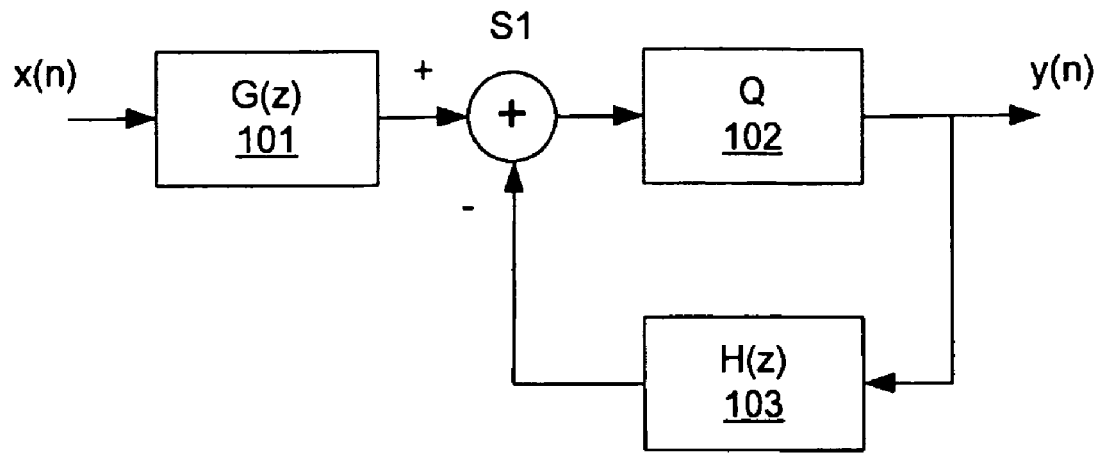
FIG. 1 shows a model of a generic sigma delta modulator.
Figure 2:
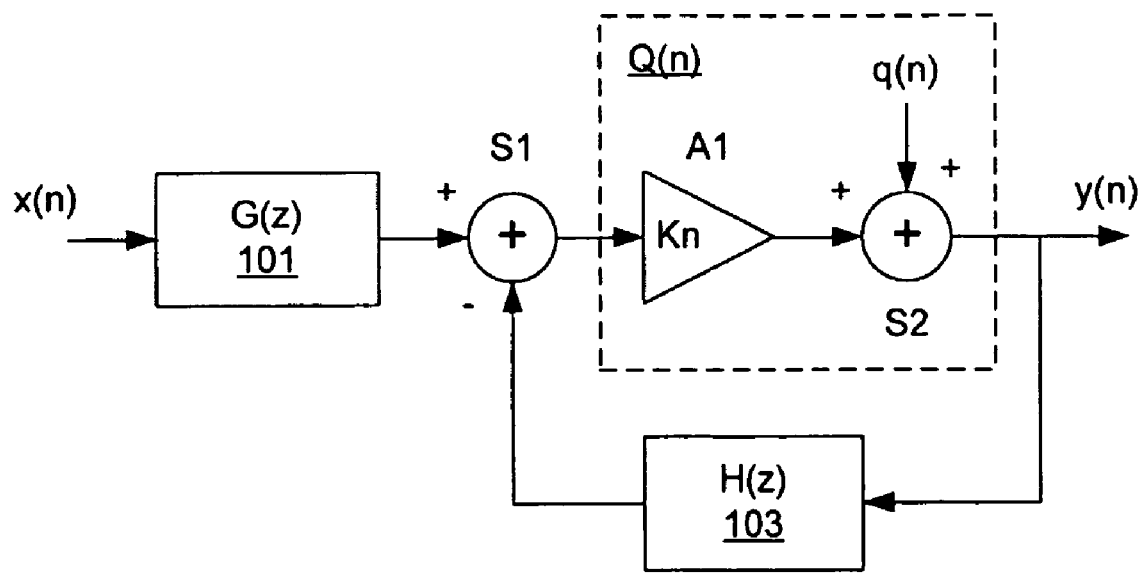
FIG. 2 shows a model of the generic sigma delta modulator with a linearized quantizer.

FIG. 2 shows a model of the sigma delta modulator with a linearized quantizer. The sigma delta modulator is shown in a discrete time domain implementation where x(n) and y(n) are an input signal and an output signal, respectively, with signal values at discrete time instances n. The modulator comprises an input filter, G(z), a quantizer, Q(z), a loop filter, H(z), and an adder, S1.

The most common way to analyze the a sigma delta modulator is to replace the highly nonlinear quantizer Q with a linearized quantizer in the form of an amplifier A1 with a gain factor, Kn, designated quantizer gain and a noise source designated q(n). The noise source contributes to the output of the quantizer via an adder, S2. Kn and q(n) comprises values at discrete time instances n. It should be noted that kn changes very slowly compared to the rate of the clock frequency. Kn and the noise source model the non-linear contribution of the quantizer.

In this description a model in the Z-domain is used, which can be used for both analogue switch capacitor implementation and a digital implementation of the modulator. This Z-domain description can be transformed to a continuous time domain description to provide an RC modulator implementation.

It should be noted that the conventional theory on linear systems cannot be used to analyze the modulator when quantizer has a relatively coarse resolution since the quantizer is then highly nonlinear. This aspect is very well described in the sigma delta modulator literature. However, by means of the linearized model the signal transfer function, STF, and the noise transfer function, NTF, are found to be (please refer to the common literature):

$$STF_{Kn}(z) = \frac{Y(z)}{X(z)} = \frac{K_n G(z)}{1 + K_n H(z)}$$

$$NTF_{Kn}(z) = \frac{Y(z)}{Q(z)} = \frac{1}{1 + K_n H(z)}$$

These are the functions that will describe the behaviour of the transfer from the input, x, to the output y and from the noise source, q, to the output, y, respectively. In order to simplify the analysis or design of the loop filter, G(z) can be set equal to H(z).

If the filter, H(z) is designed as a M'th order low-pass filter then the STF will be an M'th order low-pass filter and the NTF will be an M'th order high-pass filter and the order of the modulator is said to be of M'th order. If H(z) is designed as a band-pass filter then the STF and NTF becomes a band-pass filter and a band-stop filter, respectively. The band-pass filter is especially expedient for modern digital communications system.

Figure 3:
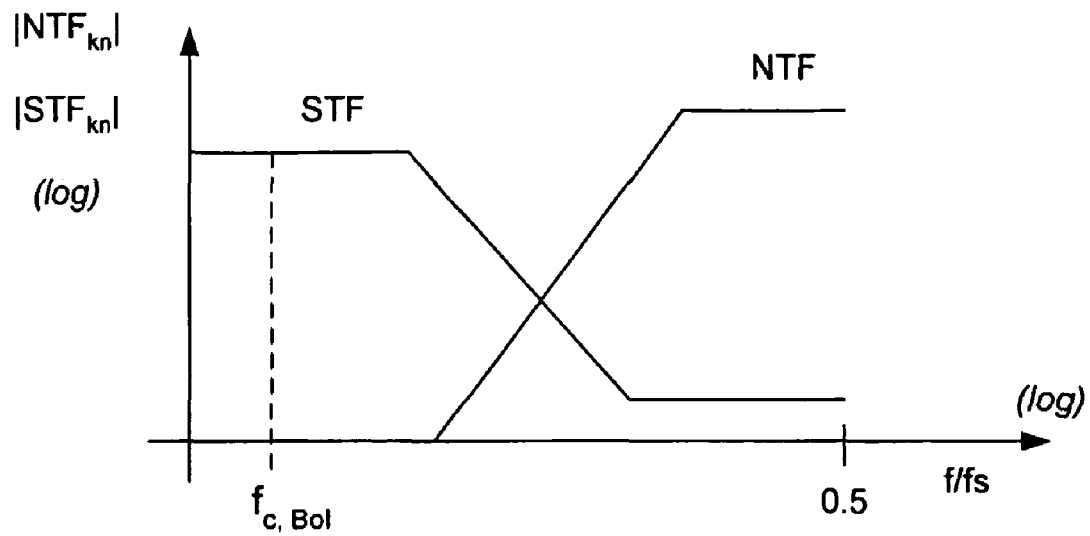
FIG. 3 shows an example of a noise transfer function and a signal transfer function of a 4'th order sigma delta converter.

FIG. 3 shows an example of the noise transfer function, NTF, and the signal transfer function, STF, of e.g. a $4^{th}$ order sigma delta converter. The transfer functions are shown as gain versus frequency, f, normalised by the sampling frequency, fs. The NTF is shown with a fixed Kn for e.g. a 4'th order Butterworth high-pass characteristic. The characteristic is obtained by means of a loop filter with a $4^{th}$ order Butterworth low-pass filter. However, other types of filter could be used e.g. a Chebychev filter. As a consequence, the loop filter establishes a signal transfer function, STF, which has a pass-band where the noise transfer function has its stop-band and vice versa. Hence, the noise attenuation of the high-pass filter, NTF, in its stop-band determines the noise level in the pass-band of the low-pass filter, STF.

As a design parameter a 'nominal frequency band' or a 'signal band' or a 'frequency band of interest' designates a frequency band in which input signals can occur and which it is desired to pass through the sigma delta modulator.

For a conventional sigma delta modulator the loop filter is designed such that the signal transfer function, STF, implements a desired 'nominal frequency band' or 'frequency band of interest' while the corresponding noise transfer function implements a desired suppression of the quantization noise. The frequency band of interest is illustrated to be located below frequencies $f_{c, Bol}$. It can be seen that $f_{c, Bol}$ is located well below the cut-off frequencies of the STF and NTF.

The better attenuation in the stop-band of the NTF means the quantization noise contribution will be lower; however, as discussed in the following, the MSA for a conventional modulator will decrease.

The STF and NTF are the functions that determine the signal processing properties of a sigma delta converter. The basic idea of a sigma delta converter is to push the quantization noise from the quantizer out of the frequency band of interest. Thereby it is possible to filter out the quantization noise, located at higher frequencies, without distorting the signal band. The quantization noise, at the higher frequencies, can be removed by a post-filter located outside the sigma delta feedback loop. In some applications (D/A converter or class-D amplifiers etc.) the post-filtering (decimation) of y(n) can be omitted, but this depends on the application where the sigma delta converter is used. The sigma delta converters have become very popular to use in recent years due to the modulation of the quantization noise property provided by the NTF function and the low cost of implementing it.

MSA Explanation

From the explanation above it is clear that the loop filter H(z) should be designed with desired NTF properties in mind, i.e. the final NTF should be very aggressive with a high number of poles and zeros, i.e. with a wide stop-band, very good stop-band attenuation and a fast transition from the stop-band to the pass-band. Unfortunately, there is a limit to how aggressive the NTF can be. If this limit is exceeded the modulator will exhibit an unstable behaviour. In the following the stability of the modulator will be discussed.

For many years it was commonly believed that it was impossible to design a stable sigma delta modulators with higher order than two. This was mainly explained to be caused by the use of a highly nonlinear quantizer in the feedback path of the modulator. This has since proven not to be true and many modulators of higher orders (i.e. a more aggressively NTF design) haves been described in the literature over the last ten years.

The key to designing higher order modulators involves the linearized model of the modulator to analyze stability. Many papers have been written about the stability problems and several stability criteria have been developed. The most common ones are:

The Gaussian stability criterion, the most popular one
The BIBO (bounded input-bounded output) criterion
The improved BIBO criterion Common to all the stability criteria is that they all depend on the norm of the NTF functions described in the noise amplification factor A(Kn), i.e. from q(n) to y(n):

$$A(K_n) = \int_{-Fs/2}^{Fs/2} |NTF_{kn}(f)|_2^2 \, df = \|ntf_{Kn}(n)\|_2^2$$

The Gaussian is based on the two-norm (as in the equation above) and the BIBO is based on the one-norm, in the following only the Gaussian Criterion is explained. For higher order modulators all $A_{(Kn)}$ curves are $\cup$ convex curves. From the above it can be realized that the shape of the noise transfer function, implemented by the loop filter, plays an important role for the stability of the modulator.

Figure 4:
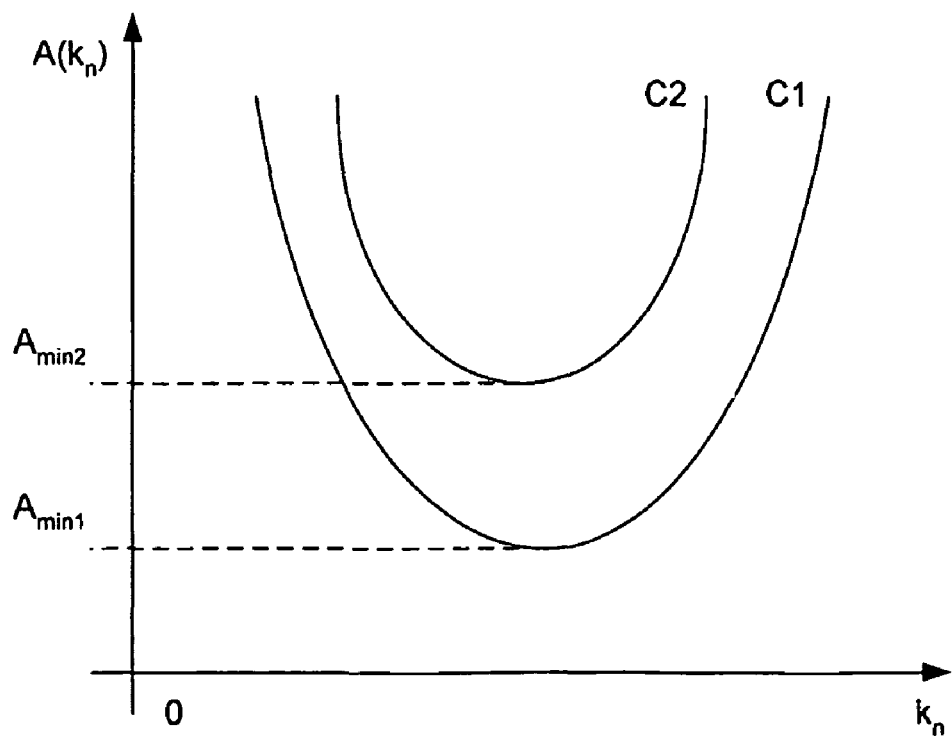
FIG. 4 shows two different curves for the noise amplification factor A as a function of a linearized quantizer amplification factor Kn.

FIG. 4 shows two different curves for the noise amplification factor A as a function of a linearized quantizer amplification factor Kn. The curves C1 and C2 are obtained for two different higher orders modulators with e.g. two $4^{th}$ order loop filters. The curves are $\cup$-convex curves, with a respective global minimum, $A_{min1}$ and $A_{min2}$, which appears at a value between $K_n=0$ and infinity.

Further it can be shown (please refer to the common literature) that the noise amplification curve, under the Gaussian quantization noise distribution assumption, also depends on the input level, $m_x$, of the modulator.

Figure 5:
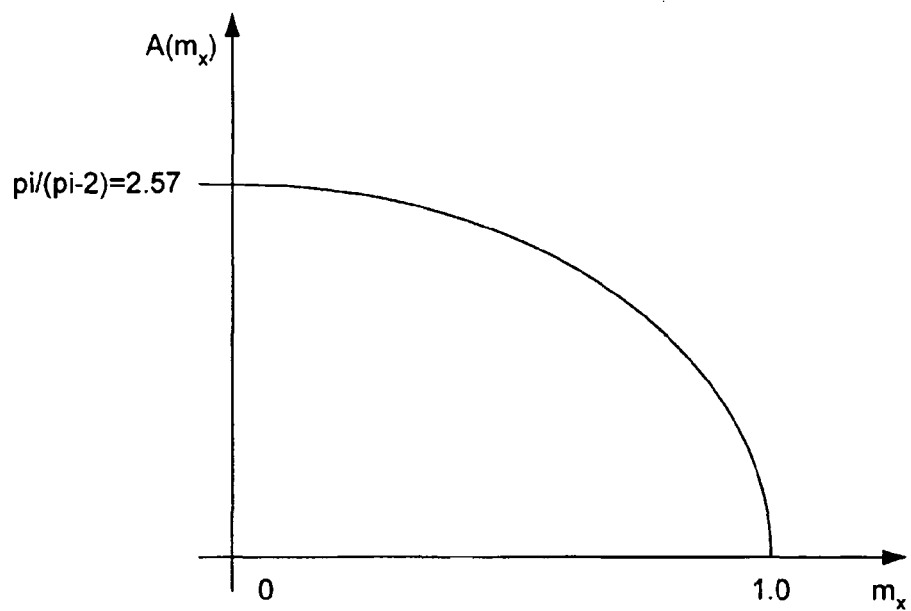
FIG. 5 shows a curve for the noise amplification factor A as a function of a signal peak value $m_x$ for a Gaussian distributed quantizer input signal.

FIG. 5 shows a curve for the noise amplification factor A as a function of a signal peak value $m_x$ for a Gaussian distributed quantizer input signal. This exemplary curve is shown for a 1-bit/two-level quantizer. It should be noted that the curve will be different for different number of levels and different threshold values of the quantizer. The curve is drawn up for a scale of numerical peak values $m_x$ between 0.0 and 1.0, where 1.0 represents a full-scale value.

The curves are drawn up from the following expression which represents the shown interdependency between the peak value $m_x$ and the noise amplification factor $A(m_x)$:

$$A(m_x) = \frac{1 - m_x^2}{1 - m_x^2 - \frac{2}{x}\exp[-2(erf^{-1}(m_x))^2]},$$

wherein erf is the error function also denoted the normal distribution probability density function and is well-known in the literature.

Here the input level $m_x$ is assumed to be the peak level of the input signal (actually a DC level is assumed because the clock frequency $F_C$ is much higher than the frequency of the signal: $F_C \gg F_{Bol}$), please note that $A(m_x)$ curves for 3, 4, . . . , N levels also exist.

As shown above, the noise amplification factor A depends on $k_n$ and $m_x$ i.e. as described by $A(k_n)$ and $A(m_x)$ in combination. A(Kn) and $A(m_x)$ are used to determine the unknown $K_n$ gain factor for a given input level $m_x$ of the modulator as described in the below.

Figure 6:
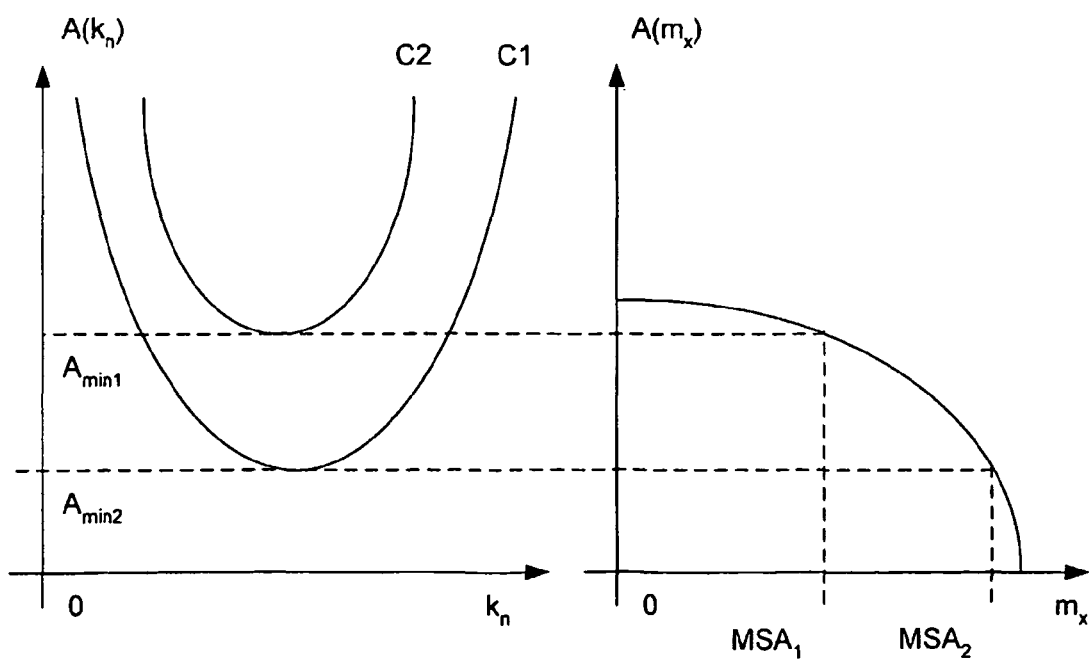
FIG. 6 shows a relation between A(Kn) and A($m_x$), quantizer gain Kn and a maximum stable input amplitude, MSA.

FIG. 6 shows a relation between A(Kn) and $A(m_x)$, quantizer gain $K_n$ and a maximum stable input amplitude, MSA.

The stable sigma delta modulator will always follow these curves and from the curves it is possible to find the maximum stable input level, denoted MSA. Limiting input amplitudes to amplitudes below MSA ensures that the modulator exhibits a stable behaviour. If the amplitude exceeds MSA, the modulator would potentially start to oscillate and become unstable.

Please note that the if the $A_{min}$ point in the A(Kn) curve is greater than the $A(m_x=0)$ point, then the modulator will be come unstable even for zero input signal.

From the explanation above it follows that the NTF function determines the $A_{min}$ point which determine the achievable MSA, the smaller $A_{min}$, the higher MSA. It can be shown from the A(Kn) function that the $A_{min}$ points depend on the area under the |NTF| function, more area means a lower $A_{min}$ and therefore a higher MSA, less area means higher $A_{min}$ meaning a lower MSA. Again, since the area under the |NTF| curve is determined by the NTF filters stop bandwidth and transition bandwidth, a small stop-band (which always is desirable due to the quantization noise suppression) means a lower MSA.

Having provided a description of the MSA aspect above, preferred embodiments utilizing this knowledge are described below.

FIG. 7a, 7b, 7c, 7d, 7e, 7f show different embodiments of a sigma delta modulator with an adaptive noise shaping control circuit. The different embodiments described below provide adaptive control of the noise transfer function, NTF, by controlling the loop filter of the sigma delta modulator which loop filter in turn determines the noise transfer function as well as the signal transfer function. The loop filter is controlled by means of an adaptive noise shaping, ANS, control circuit. The noise transfer function, NTF, is shaped adaptively in response to an adaptation signal. The adaptation signal is a signal which to a certain degree correlates with the maximum input amplitude i.e. the peak value $m_x$. The adaptation signal is a signal which to a certain degree is correlated with the input signal. Different ways of providing the adaptation signal are described below in connection with the embodiments.

The adaptive noise shaping can result in the pass-band of the signal transfer function being changed. In most cases however, the changes of the STF will be well above the band of interest and thus of no concern.

When the input to the modulator is an analogue signal, x(n) is an analogue signal sampled at time instances n. n is time instances of the clock frequency at which the sigma delta modulator is operated. In practical implementations it is typically sufficient to sample x at the Nyquest frequency, but signal processing of the sampled signal is carried out at the over-sampled sample frequency which is conveniently denoted the clock frequency.

However, the input to the modulator can also be a digital signal x(n) with sequential digital values at sample time instances n. Typically, x(n) is a single bit signal.

Please note that paths of control signals are depicted as lines with not filled arrows, whereas paths of other signals are depicted as lines with filled arrows.

Figure 7A:
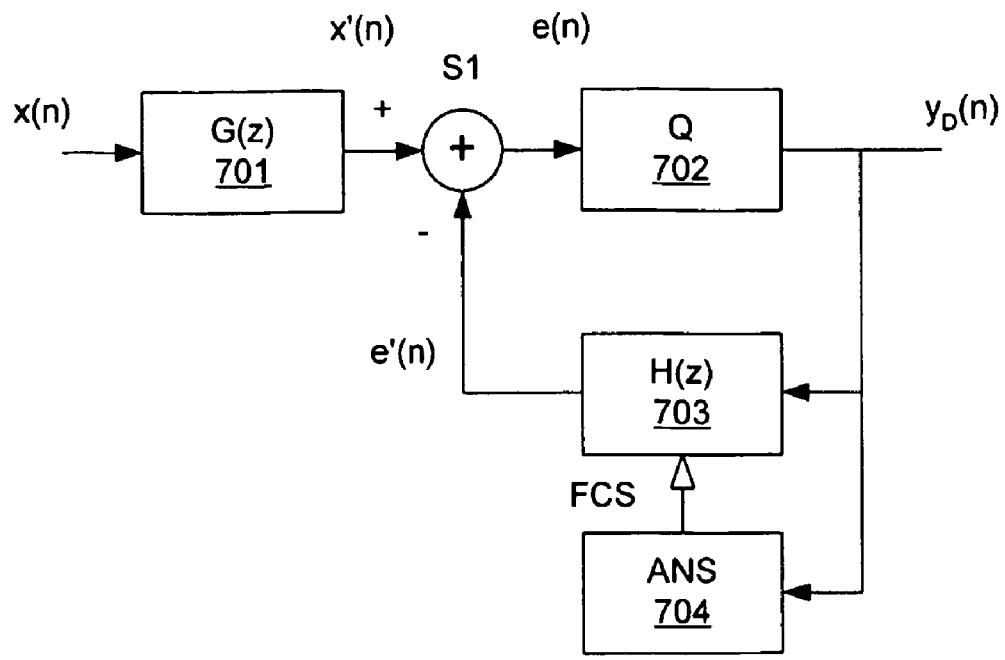
FIG. 7a, 7b, 7c, 7d, 7e, 7f show different embodiments of a sigma delta modulator with an ANS control circuit.

FIG. 7a shows a first embodiment of a sigma delta modulator with an adaptive noise shaping control circuit. The sigma delta modulator comprises a quantizer Q, 702 which provides a discrete output signal y(n) at time instances n determined by a clock signal of the modulator. The output signal y(n) is provided to the input of a loop filter H(z), 703 which filters the input signal and provides a filtered output signal e'(n). The filtered output signal e'(n) is subtracted from a filtered input signal x'(n) by means of an adder S1. The filtered input signal x'(n) is provided via an input filter G(z), 701 which filters an input signal x(n). The filter G(z) does not belong to the sigma delta modulator loop and does not contribute to the noise transfer function, NTF. However, G(z) is incorporated in this description of a preferred embodiment since it provides a more generic description of the sigma delta modulator.

The gain transfer function of the filter H(z) is controllable in response to a filter control signal, FCS. Due to the configuration of the sigma delta modulator, the noise transfer function changes when the gain transfer function of the filter H(z) is changed. Thus, the noise transfer function is indirectly controllable. The filter control signal, FCS, is provided by an adaptive noise shaping control circuit ANS, 704. The form of the FCS depends on the implementation of the loop filter H(z), 703.

In a digital implementation the control signal will either address a set of pre-computed filter coefficients of H(z) or provide incremental changes of such filter coefficients based on calculations performed 'on the fly'. Whereas, in an analogue (switch capacitor) implementation the control signal controls switches which determine the coefficients by switching capacitors between different configurations. Thereby the coefficients are controlled. This technique is known in the art of switch capacitor technology.

In this embodiment, the output signal y(n) is selected as a signal which correlates with the input signal and it is therefore a suitable adaptation signal. Based on the adaptation signal or a processed adaptation signal, the ANS controller 704 makes a decision on which filter coefficients to select in order to obtain a quantization noise transfer function with an Amin value sufficiently low to obtain an MSA value above the detected value of the adaptation signal. Since the adaptation signal is correlated with the input signal it can be assumed that the modulator will be in a stable state.

The configuration of this first embodiment is particularly suitable for use in applications where the input is an analogue signal and the output is a digital signal e.g. in A/D converters. Thereby, the adaptation signal is provided as a digital signal which is compatible with a digital ANS controller. In order to save chip die area, a digital ANS controller is preferred.

Thus, the adaptive noise shaping method comprises the steps of controlling the frequency response of the loop filter and thereby the noise transfer function (and signal transfer function as a side effect) in response to a value of a signal feature. The signal feature is also known as the adaptation signal. The signal feature is correlated to the input signal, x(n), of the modulator. In this way the Noise Transfer Function is adapted to the input signal of the modulator, and we have an Adaptive Noise Shaping control of the modulator. Preferably, the signal feature is correlated with the input signal in the signal band or band of interest.

Figure 7B:
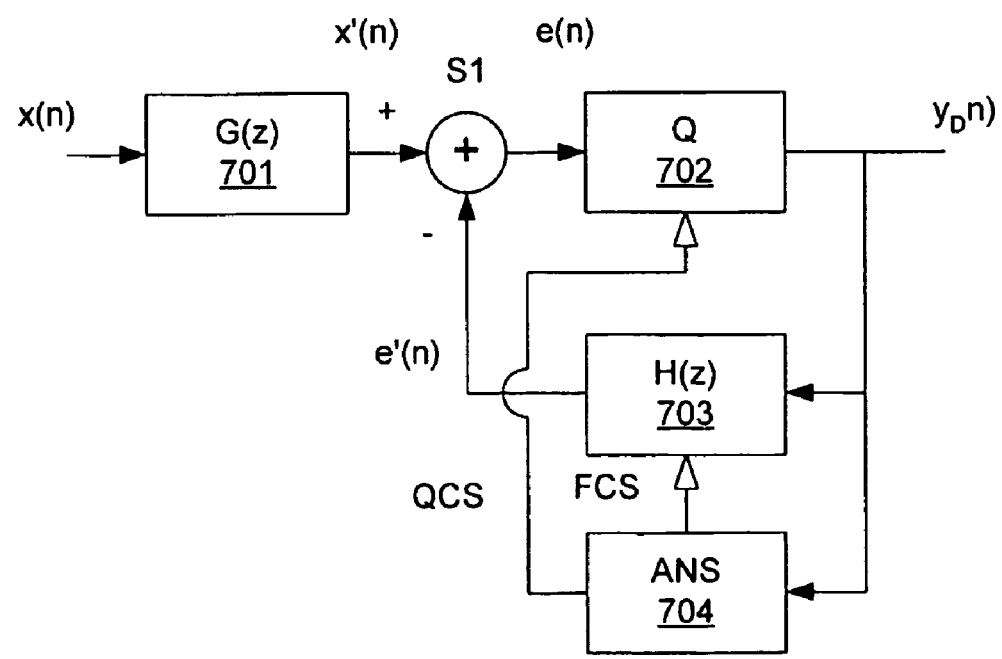

FIG. 7b shows a second embodiment of a sigma delta modulator with an adaptive noise shaping control circuit. Also in this embodiment the output signal y(n) is selected as adaptation signal.

For modulators based on quantizers with more than two levels, it is experienced that the thresholds at which the quantizer changes its output signal level changes the noise transfer function to some extent. This is utilized to provide more freedom in shaping the quantization noise. The ANS controller therefore provides a quantization control signal QCS which determines which threshold levels to use in the quantizer. The control signal either addresses pre-computed threshold levels of the quantizer or provides an incremental adjustment of the threshold(s).

A two level quantizer is very easy to implement since it requires only a comparator to determine whether the signal is negative or positive and this will determine the final output bit of the modulator. If used in an analogue implementation of the modulator the output bit will have to be converted into the analogue domain again before feedback to the loop filter 703 i.e. it is converted into plus reference voltage or minus reference voltage (alternatively, a ground reference). The value of the reference voltage is a part of the feedback signal path of the modulator and therefore the reference is also part of the Noise Transfer function of the modulator. Therefore it can be controlled by the ANS controller in order to control the noise shaping.

The case is different for a 3 or 4 or N level comparator, here only the 3 level case will be explained. In the three level case the quantizer has two thresholds, Pth and Nth, that determine the output signal of the quantizer, normally these thresholds are equal in absolute value and differ only by the sign. It can be shown that these threshold values among others are an important factor in the stability criterion of low level modulators. As a consequence the threshold values control the noise transfer function of the modulator and therefore it can be adjusted by the ANS controller.

Figure 7C:
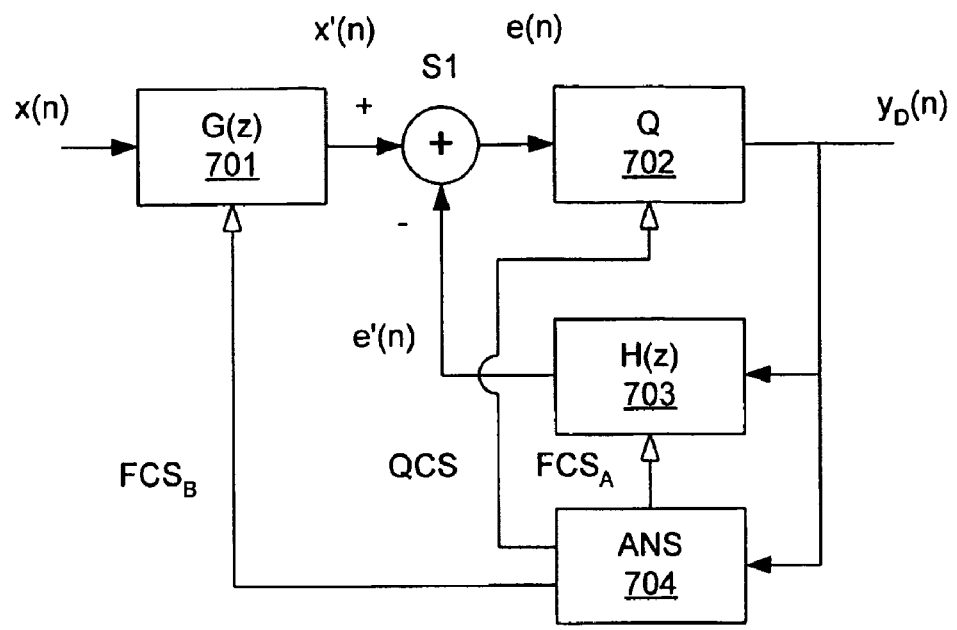

FIG. 7c shows a third embodiment of a sigma delta modulator with an adaptive noise shaping control circuit. Also in this embodiment the output signal y(n) is selected as adaptation signal.

The adaptive noise shaping, control circuit ANS, 704 provides a first filter control signal $FCS_A$ to the loop filter H(z), 703 and a second control signal $FCS_B$ to the pre-filter G(z), 701 configured to filter the input signal x(n) and to provide a filtered input signal x'(n). The control signal $FCS_B$ is configured as the control signal FCS described above. The adaptive noise shaping controller ANS, 704 is configured, in combination with the filter G(z), to control the transfer function of the filter 701. The transfer function G(z) of filter 701 is controlled to equalize the transfer function y(n)/x(n). This is expedient especially when the pass-band of loop filter 703 has been reduced so excessively that the signal band is affected. In this situation the pre-filter is controlled as an equalizer to compensate for the otherwise affected signal band. However, it should be noted that the filter 701 can be controlled for other purposes than equalizing.

Figure 7D:
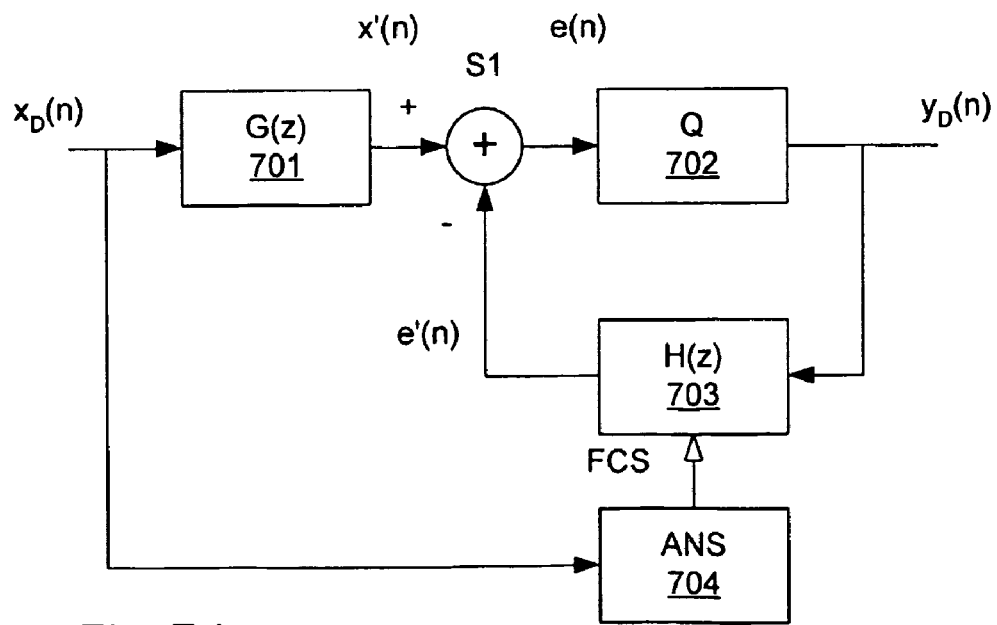

FIG. 7d shows a fourth embodiment of a sigma delta modulator with an adaptive noise shaping control circuit. Note that in this embodiment the input signal x(n) is selected as adaptation signal.

The configuration of this fourth embodiment is particularly suitable for use in applications where the input is a digital signal (a multi-bit signal or single bit signal) e.g. as in D/A converters or class-D amplifiers. Thereby, the adaptation signal is provided as a digital signal which is compatible with a digital ANS controller. As noted above, a digital ANS controller is preferred in order to save chip die area.

In this embodiment the input signal x(n) is selected as adaptation signal. The input signal is directly related to the MSA stability criterion and provides therefore the best choice as adaptation signal for the ANS controller when the input signal and the controller are compatible in terms of being either in the digital or analogue domain.

Figure 7E:
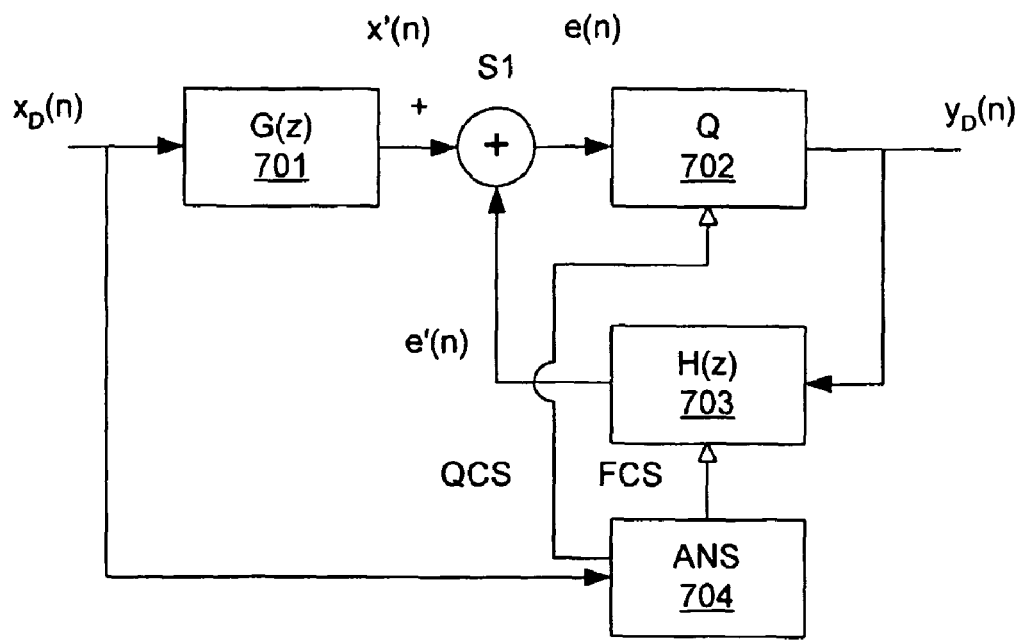

FIG. 7e shows a fifth embodiment of a sigma delta modulator with an adaptive noise shaping control circuit. In this embodiment the input signal x(n) is selected as adaptation signal.

The ANS controller provides a quantization control signal QCS which determines which threshold levels to use in the quantizer. The control signal either addresses pre-computed threshold levels of the quantizer or provides an incremental adjustment of the threshold(s).

Figure 7F:
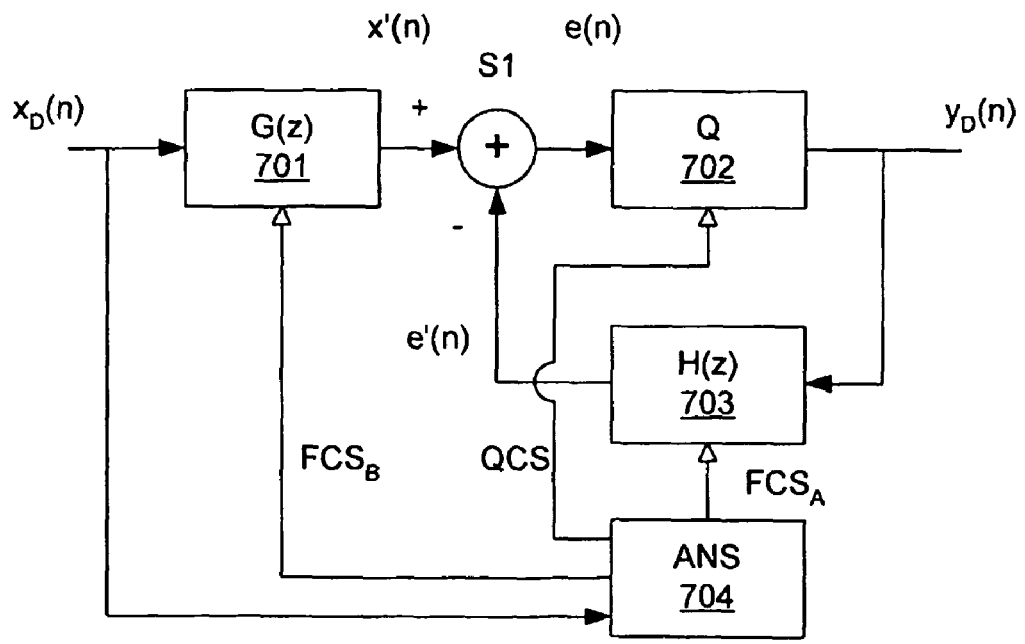

FIG. 7f shows a sixth embodiment of a sigma delta modulator with an adaptive noise shaping control circuit. Also in this embodiment the adaptation signal is the input signal x(n).

The adaptive noise shaping control circuit ANS, 704 provides a first filter control signal $FCS_A$ to the loop filter H(z), 703 and a second control signal $FCS_B$ to the pre-filter G(z), 701 configured to filter the input signal x(n) and to provide a filtered input signal x'(n). The control signal $FCS_B$ is configured as the control signal FCS described above. The adaptive noise shaping controller ANS, 704 is configured, in combination with the filter G(z), to control the transfer function of the filter 701. The transfer function G(z) of filter 701 is controlled to equalize the transfer function y(n)/x(n). This is expedient especially when the pass-band of loop filter 703 has been reduced so excessively that the signal band is affected. In this situation the pre-filter is controlled as an equalizer to compensate for the otherwise affected signal band. However, the filter 701 can be controlled for other purposes than equalizing e.g. pass-band reduction.

With reference to the embodiments described above, it should be noted that other signals than the input signal x(n) and the output signal y(n) can qualify as a signal which is correlated with the input signal and therefore be selected as adaptation signal. The state variables inside the modulator i.e. the implementation of the H(z) rational polynomial, also contain valuable information about the peak value. This could also serve as an input to derive an estimate of the $m_x$ value. The state variables are correlated with the input signal, but will typically require low-pass filtering (for a low-pass modulator) in order to qualify as a suitable adaptation signal.

In general it should be noted that the embodiments are described as analytical models since description of the practical embodiments would complicate the description unnecessarily. A person skilled in the art will be able to provide practical implementations of the embodiments.

The embodiments shown in FIG. 7a-c are used for analogue implementation of the modulator in e.g. switch-capacitor technology and analogue input signal. Output y is in digital form, and ANS is implemented in digital technology. The control signals (comprising the control signal to the filter 703) are single- or multi-bit signals with 1 to $P_i$ bits per integrator i where i=1 to N. FIG. 7a is primarily used for A/D conversion (suitable for analogue input).

Alternatively, the embodiments shown in FIG. 7a-c are provided with a digital input for class-D or D/A applications. Here, the digital output signal will be post-filtered by a low-pass filter to provide an analogue output signal. From an implementation point of view pure digital implementation is possible since the modulator does not have to process analogue signals (can be used for digital input).

Figure 8:
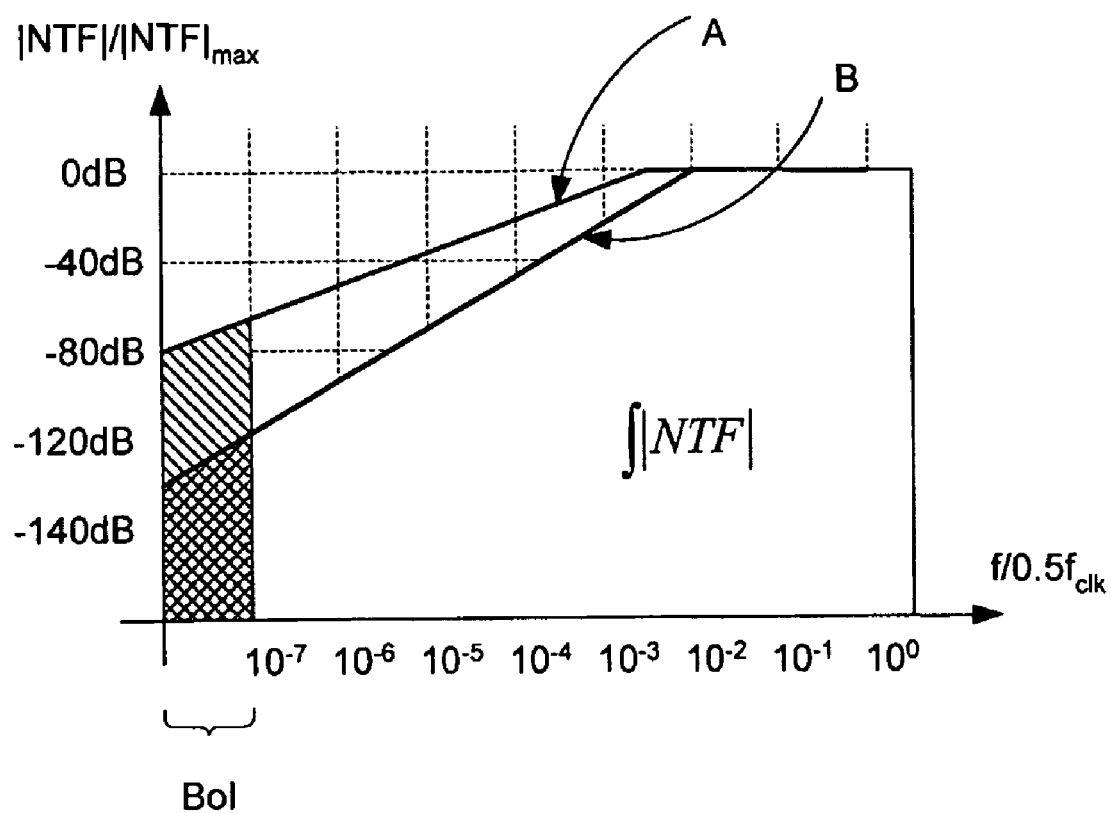
FIG. 8 shows different noise levels in a frequency band of interest.

FIG. 8 shows two examples of different NTF amplitude responses. The A and B curve emphasizes that the area under the NTF curve is an important parameter for the final noise contribution in the frequency band of interest.

It would always be desirable to have a high MSA, equal to 1.0 and at the same time achieve a high suppression of the quantization noise when low input signal is applied to the modulator, and since these two wishes are conflicting there is a need for obtaining these features, and this is what the current invention is providing.

From the above paragraph of the modulator analysis it follows that the peak value mx must be below a certain limit called the MSA and there is a trade off between MSA and the quantization noise. From this it follows that the MSA should be adapted to the peak value mx in order to achieve the maximum dynamic range. The invention circumvents the above mentioned trade-off between noise suppression and maximum input signal determined by the MSA, by dynamically altering the NTF and thus the noise suppression and MSA.

Figure 9A:
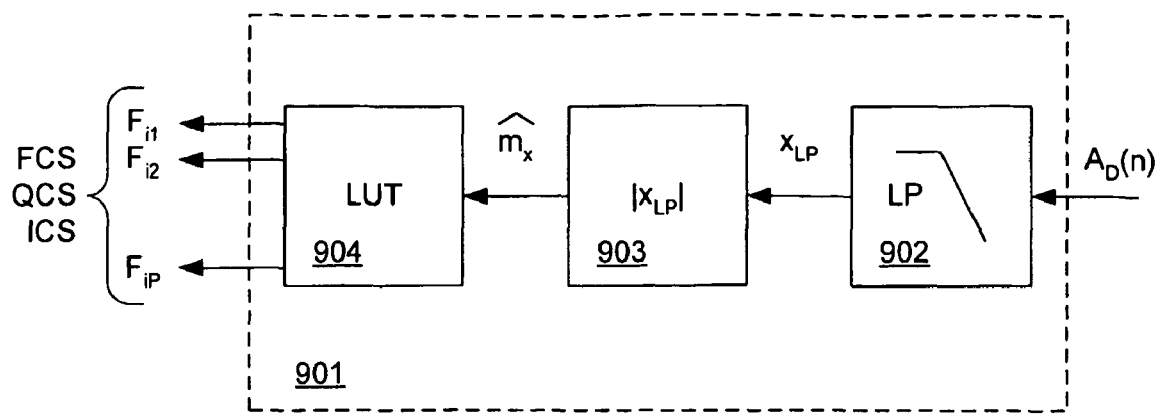
FIG. 9a shows a generic ANS control circuit in greater detail.
Figure 9B:
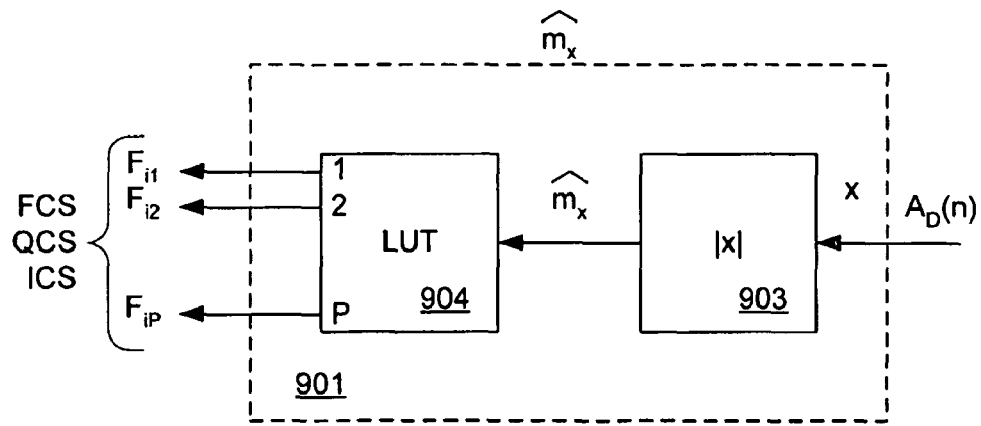
FIG. 9b shows a preferred embodiment of the ANS control circuit.
Figure 9C:
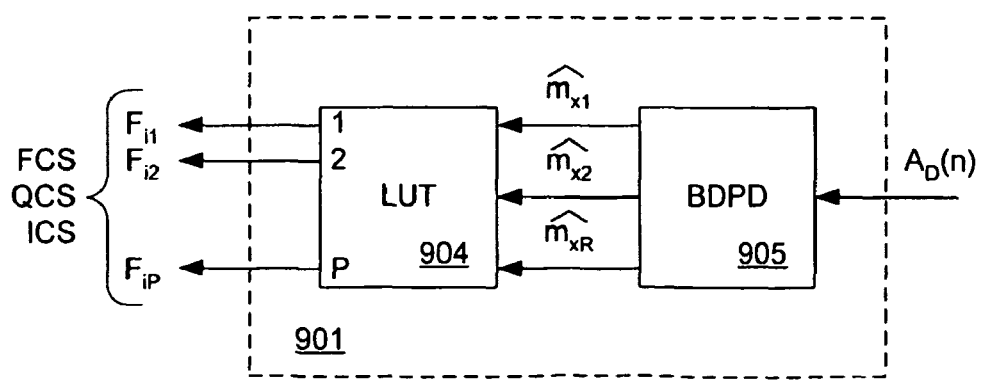
FIG. 9c shows another preferred embodiment of the ANS control circuit.

FIGS. 9a, 9b and 9c shows different embodiments of the adaptive noise shaping control circuit, ANS.

The ANS controller 901 receives the selected adaptation $A_D(n)$. The adaptation $A_D(n)$ is selected as a signal correlated with the input signal and preferable as a signal in the digital domain cf. the subscript 'D'. This is expedient since the ANS controller is typically implemented in digital technology and the adaptation signal is thereby compatible with the ANS controller. The adaptation signal is a digital signal (single- or multi-bit).

FIG. 9a shows a block diagram of preferred embodiment of the adaptive noise shaping control circuit. This embodiment is expedient when the adaptation signal is taken as the output signal $x_D(n)$ from the modulator (and thus the quantizer). Thus $A_D(n)=x_D(n)$. The adaptation signal (or signal feature) is provided to a low-pass filter 902 which is configured to remove or rather attenuate quantization noise present in the adaptation signal. The low-pass filter provides a filtered signal $x_{LP}(n)$. Output from the low-pass filter is a digital single- or multi-bit signal.

The low-pass filter 902 is followed by double rectification (providing the numerical value of $x_{LP}(n)$. The output from the double rectification can be considered to be an estimate of the peak value mx. The double rectification is provided since typically the MSA stability criterion is symmetrical and consequently fewer adaptation levels is needed. Further, the decision on which control signals $FCS_A$, $FCS_B$, QCS to provide to the loop filter and/or input filter and/or quantizer can be performed by a relatively simple lookup table LUT, 904.

The lookup table LUT, 802 comprises a comparator and one or more threshold values which determine the adaptation levels. Based on the output from the comparator an address of the look-up-table is determined. Typically, however the most significant bits of the numerical value are used to address the look-up-table. Thus, based on the estimated $m_x$ value a pre-computed set of filter parameters is addressed to determine how the loop filter and/or quantizer and/or pre-filter should be adjusted in order to achieve the desired noise shaping properties. For a switch capacitor implementation the LUT will store information about which switches to close or open, whereas the coefficient values are implemented and determined by the switched capacitors.

The control signals FCS and/or QCS are provided as a multi-bit signal by the lookup table 904. Further control signals, for controlling the noise transfer function, e.g. an integrator control signal ICS as described in succeeding paragraphs are also provided by the lookup table.

In an alternative embodiment, the signal from the low-pass filter 902 can be supplied directly to the lookup table 904. However, in this case the LUT is configured to handle both positive and negative peak values mx.

In general, the signal $\hat{m}_x$ is provided by a peak detector. In the above, the low-pass filter 902 and the double-rectifier 903 constitute the peak detector.

FIG. 9b shows another preferred embodiment of the adaptive noise shaping control circuit. This embodiment is especially useful when the modulator is a digital modulator with a digital input signal. Thus, the input signal $x_D(n)$ to the modulator can be selected as adaptation signal $A_D(n)$.

The low-pass filter is omitted since the input to the ANS controller is taken from the digital input to the modulator and is thus not distorted by quantization noise. In this case, the peak detector is constituted by the double rectifier 903 which provides the estimated peak value $\hat{m}_x$.

Further, the rectification could be omitted and the signed peak value (or values) $m_x$ could directly serve as input to the ANS control circuit.

FIG. 9c shows another preferred embodiment of the adaptive noise shaping control circuit, ANS. In this embodiment the adaptive noise shaping control circuit 901 is configured to estimate the peak value $\hat{m}_x$ in different frequency bands designated 1, 2, . . . , R.

This estimation is performed by a filters selecting specific frequency bands, where the frequency band limited output signals from the filters are provided to respective peaks detectors. The lookup table 901 is configured to provide the control signals $F_{i1}, F_{i2}, \ldots, F_{iP}$, based on a decision which depends on the estimated peak values $\hat{m}_{x1}, \hat{m}m_{x2}, \ldots, \hat{m}_{xR}$.

Thus, the adaptation signal (or signal feature) is divided into several frequency bands and subsequently peak detections on each band are performed. Thereby a weighing of the signal content in the frequency bands can be used.

The peak detector could be implemented in many different ways, but the preferred implementation will depend on the application.

The phrase 'peak detector' should be comprehended very broadly, some alternative examples of a peak detector are:

- A peak detector with different release time and/or attack times, Especially the combination of "as close as possible to 0" attack time and different release time is interesting in that it ensures a conservative design where the peak value follows the signal envelope at the oversampled rate;
- A peak detector (located before the LUT) that takes the maximum value over the last e.g. 10 (between 1 sample and OSR=over-sampling ratio samples) samples ensures a conservative design where a short attack time is provided and a final release time is provided.

The signal feature (or adaptation signal) is a signal or signal vector that are correlated to the input signal of the modulator, the signal feature is use as input to the ANS control circuit that is preferably implemented in digital logic/software. Here number 1) and 2) is the preferable choice.

EXAMPLES

1) If the input signal to the modulator is digital (i.e a digital implementation), then the signal feature could be the input signal, here the signal feature vector contains only one element.
2) If the input signal is analogue (i.e an analogue implementation) then the signal feature could be the output from the modulator, here the signal feature vector contains only one element.
3) If the input to the modulator is digital then the signal feature of the modulator could be the input to the quantizer and the output of the modulator, here the signal feature contains two elements.
4) If the modulator is implemented as a cascade of integrators (see figure X1 and X2) then each or any combination of output from the integrators could be a signal feature. If an analogue implementation is used then ANS control circuit needs to be partly implemented in analog circuits as well. For digital implementation of the modulator the outputs from each integrator is already represented in the digital domain and the ANS control circuit could be implemented in digital technology which is very feasible.
5) Any state variable in the modulator could be used at elements in the signal feature vector.

Figure 10:
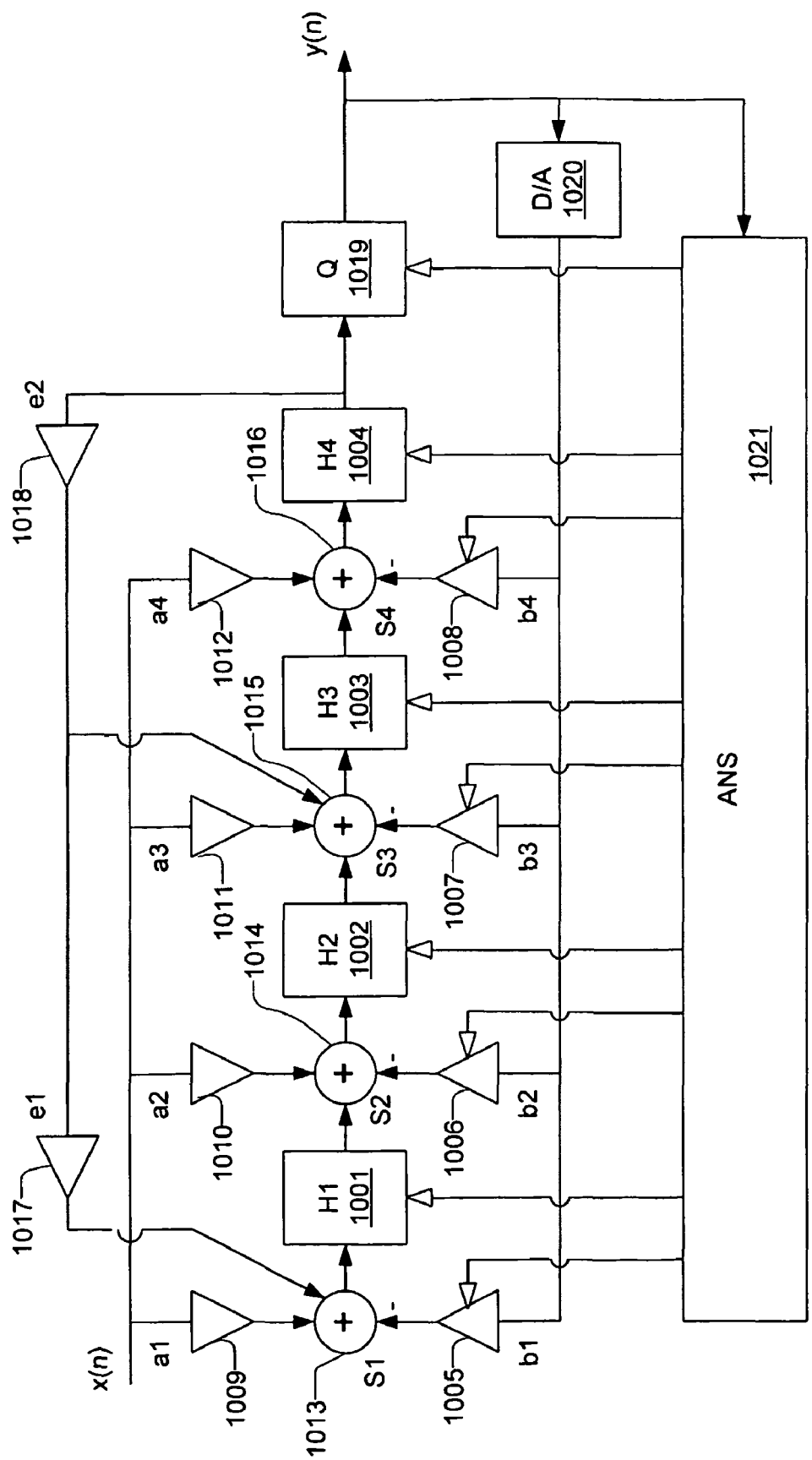
FIG. 10 shows a preferred embodiment of the sigma delta converter with an adaptive noise shaping controller.

FIG. 10 shows an embodiment of a sigma delta modulator with an adaptive noise shaping controller, ANS. This embodiment is expedient when the input signal is an analogue signal.

The embodiment comprises a loop filter which is based on a well-known filter configuration where a number of (first order) integrator stages are cascaded. The filter configuration can be used for a switch capacitor implementation or an RC implementation.

The sigma delta modulator comprises four integrator stages each with an integrator H, an adder S, a feed-forward coefficient a, and a feedback coefficient b. Additionally, resonator coefficients are implemented for every second integrator stage (i.e. every second order). The integrators are designated H1, 1001; H2, 1002; H3, 1003 and H4, 1004. The adders are designated S1, 1013; S2, 1014; S3, 1015 and S4, 1016; the feed-forward coefficients a1, 1009; a2, 1010; a3, 1011 and a4, 1012 and the feedback coefficients b1, 1005; b2, 1006; b3, 1007 and b4, 1008. The resonator coefficients are designated e1, 1017 and e2, 1018. Thus, a fourth order modulator is shown, but it is easily extendable to fifth or sixth order by cascading more integrator stages. The number of integrator stages determines the order of the modulator.

The last integrator H4 of the cascaded integrator stages H1-H4 provides a signal to the quantizer Q, 1019. In response to its input signal the quantizer Q provides a discrete output signal. The output signal of the quantizer provides the output signal of the sigma delta modulator. The output signal y(n) is provided as a digital stream of discrete numbers, i.e for each clock cycle one output word is produced. If the number of output levels is 2, then 1 bit for each clock period or integration period is produced.

The conventional feedback path of the modulator is established by feeding the output signal back to the loop filter.

Since the output is provided in the digital domain and the filter operates in the analogue domain, the D/A converter is provided in the feedback path to provide conversion from the digital domain to the analogue domain. As it is shown the feedback signal is supplied to each integrator stage of the filter via the feedback coefficients b.

Additionally, a feedback signal for controlling the adaptation of the filter to the input level is provided to the adaptive noise shaping controller, ANS, 1021. In this embodiment the feedback signal is selected as the output signal y(n). The feedback signal for controlling the adaptation of the filter is also denoted an adaptation signal.

It is well known that the 'a' coefficients determine the zeros in the STF and that they do not affect the NTF. The 'b' coefficients determine the NTF and the 'e' coefficients set the complex pole/zeros in the NTF/STF. If the 'e' coefficients are omitted then a simple sigma delta modulator of the low-pass type is provided i.e all the 'e' coefficients are set equal to zero. Otherwise, a general modulator of the band-pass type is provided. It should be noted that the low-pass type is a subset of the band-pass type. If the modulator is of the band-pass type, each pair of integrator in combination with an e-coefficient corresponds to a resonator.

Computing coefficients for the filter is not a trivial task, but the digital signal processing literature comprises information about how to compute the filter coefficients. To this end it is known to compute filter coefficients which provide a desired noise transfer function while obtaining a desired signal transfer function.

The noise shaping control circuit, ANS, controls the filter coefficients by means of a filter control signal FCS. Additionally, the ANS control circuit is able to control a gain factor of the individual integrators H1-H4 by means of an integrator control signal, ICS. Moreover, the ANS control circuit is able to control thresholds of the quantizer, Q, by means of a quantizer control signal, QCS. The latter is particularly expedient when the quantizer provides more than two levels. Control of these parameters can provide control of the noise transfer function, NTF.

The ANS control circuit controls the filter coefficients and optionally parameters of the integrators and the quantizer threshold(s) by means of the above control signals. These control signals are depicted by lines with not filled arrows, whereas other signals are depicted as lines with filled arrows.

The noise shaping control circuit, ANS, is preferably implemented as a digital circuit with input from the quantizer, but can also be implemented as an analogue circuit. The ANS provides an output which is a digital signal that controls a switch (or several switches) in the integrator $H_i$. Further, the gain k, feedback coefficients b, and step size in the quantizer can be controlled. This is especially expedient for modulators with 3, 4 and higher number of levels.

Despite the embodiment described above, it is a preferred embodiment when an analogue implementation is used, it can also serve as an embodiment for a digital implementation of the digital modulator. But since the $f_i$ value in the integrators $H_i$ in general are real values between 0 and 1 it requires a multi-bit multiplication with the multi-bit integrator outputs and this is not very feasible.

Figure 11A:
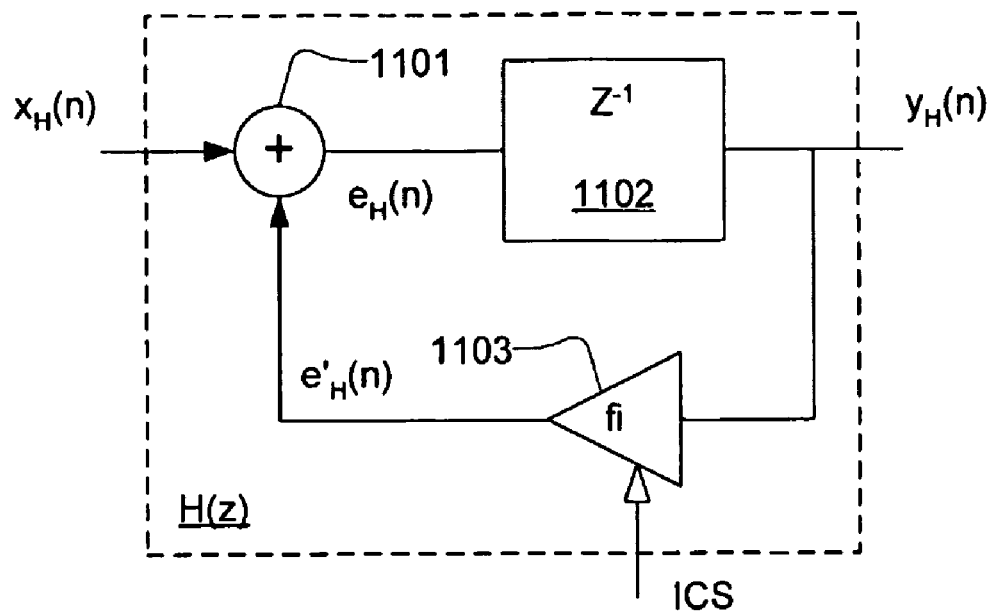
FIGS. 11a and 11b show block diagrams of the integrator $H_i(z)$ of the modulator in FIG. 10.
Figure 11B:
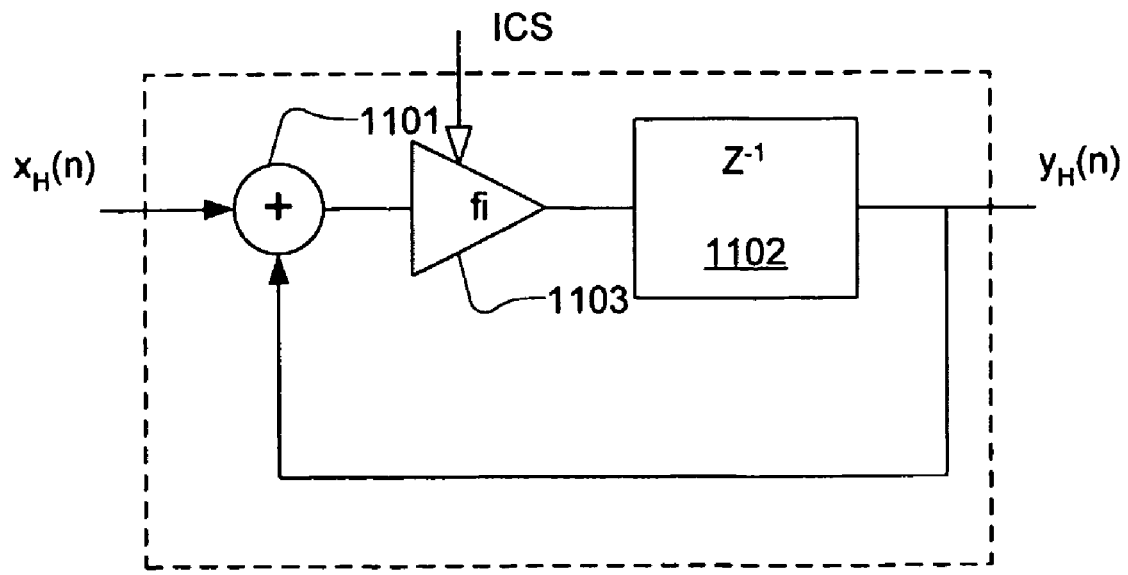

FIGS. 11a and 11b show block diagrams of the integrator H(z) of the modulator. The input to integrator H(z) is a sampled analogue signal (i.e. a signal which is discrete in time, but continuous in value) $x_H(n)$, provided by the adder of the integrator stage and a digital integrator control signal, ICS, provided by the ANS control circuit. The digital integrator control signal, ICS, determines the value of a gain factor $f_i$, 1103.

As shown in FIG. 11a, the integrator H(z) comprises an adder 1101, which receives the signal $x_H(n)$ input to the integrator and a feedback signal $e_H'(n)$. The adder provides an output signal e(n) which is provided to a delay element $z^{-1}$, 1102. The feedback signal is provided via a controllable gain factor f, 1103. When f has a value equal to 1, an ideal integrator is provided. But, when f has a value less than 1, an integrator with a certain amount of loss is provided. When the gain factor f is decreased, the integrator is exposed to a greater loss. This, in turn, will change the corresponding NTF function to a less aggressive high pass filter. An expedient way to implement the adaptation strategy is thus to add more loss to the integrators when an adaptation signal, correlated with the input signal, increases.

The integrator control signal, ICS, can be a 1-bit digital signal which e.g. addresses or selects a gain factor of f equal to f=1 for ICS is digitally 'off' and a gain factor of f equal to f=0.8 when ICS is digitally 'on'.

In a switch capacitor implementation this is realized by removing a specific amount of charge on the integrating capacitor of the integrator in each clock period the ICS signal is 'on'. The amount of charge that is removed corresponds to the value f. In an alternative embodiment, one or several controllable gain factors are coupled in parallel with the gain factor f, 1103. Thereby different amounts of loss can be introduced, but at the cost of additional switches, capacitor and control bits.

In FIG. 11b an alternative embodiment of the integrator H(z) is shown. In this embodiment the loss is also implemented by means of the gain factor f, 1103, but the gain factor is located between the adder 1101 and the delay 1102.

In the embodiments of the integrator, losses are used to change the NTF, but as described above other solutions are also suitable; e.g. changing the filter coefficients and/or changing the resolution of the quantizer. That is, basically any parameter which changes the noise transfer function, NTF.

Figure 12A:
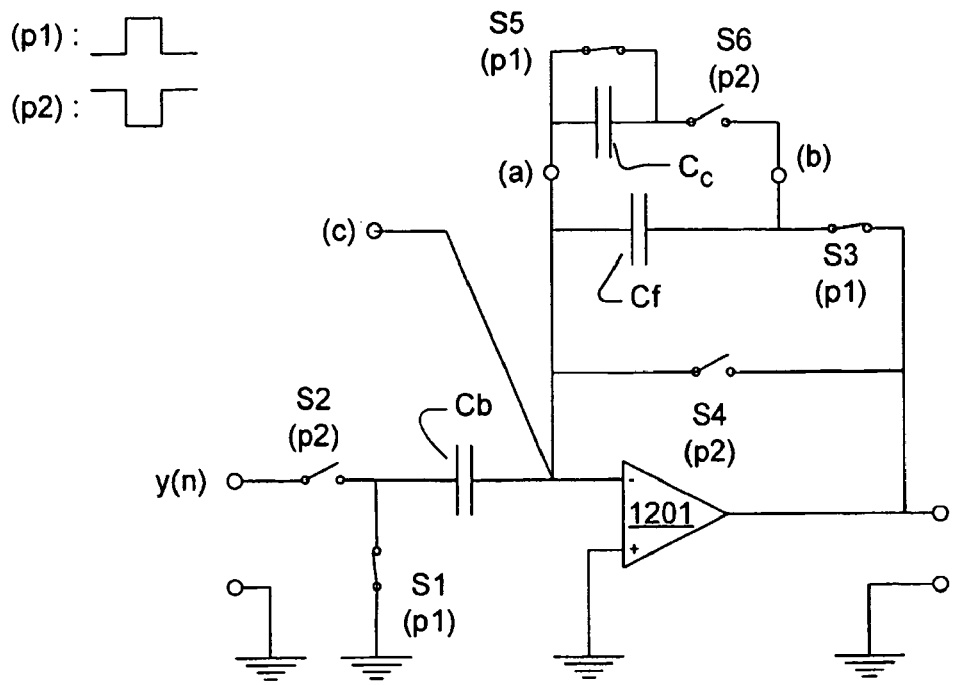
FIG. 12a shows a switch capacitor implementation of an integrator.

FIG. 12a shows an embodiment of an integrator, implemented in switch capacitor technology, coupled to receive a loop filter feedback via a b-coefficient.

The factors or coefficients are provided by means of an operational amplifier which is coupled to a feedback network and an input network. The feedback network comprises a capacitor Cf in series with a switch S1. In parallel therewith a switch S2 is provided. The input network comprises a series capacitor Cy which provides the input signal to the operational amplifier via a switch S4 on the input side of the capacitor Cy. Further, on the input side of the capacitor a switch S3 is coupled to a ground reference. The switches are operated at a clock frequency to switch the charges of the capacitors alternately. It should be noted that switch capacitor technology is well-known in the art. The value of the b-coefficient or factor is determined by the ratio of Cf to Cy.

This figure only shows the feedback signal path, the feed-forward path require an additional capacitor Ca with the arrangement of switches as the Cy, again the 'a' coefficient are determined by the relation between the integrating capacitor Cf and the feed-forward capacitor, likewise for the other input to the node. These are all well known techniques.

In order to have a controllable loss in the integrator as shown in FIGS. 11a and 11b, the integrating capacitor Cf is partially discharged. The partial discharge is obtained by a configuration where a clamping capacitor Cc is alternately coupled in parallel with the integrating capacitor Cf and alternately to a short circuit. This switching is performed by means of switches S5 and S6.

Further feed-forward or feedback paths via coefficients (b- and/or e-coefficients) can be supplied to the summing node, at the inverting input of the operational amplifier, like the feedback path with the b-coefficient is provided.

Figure 12B:
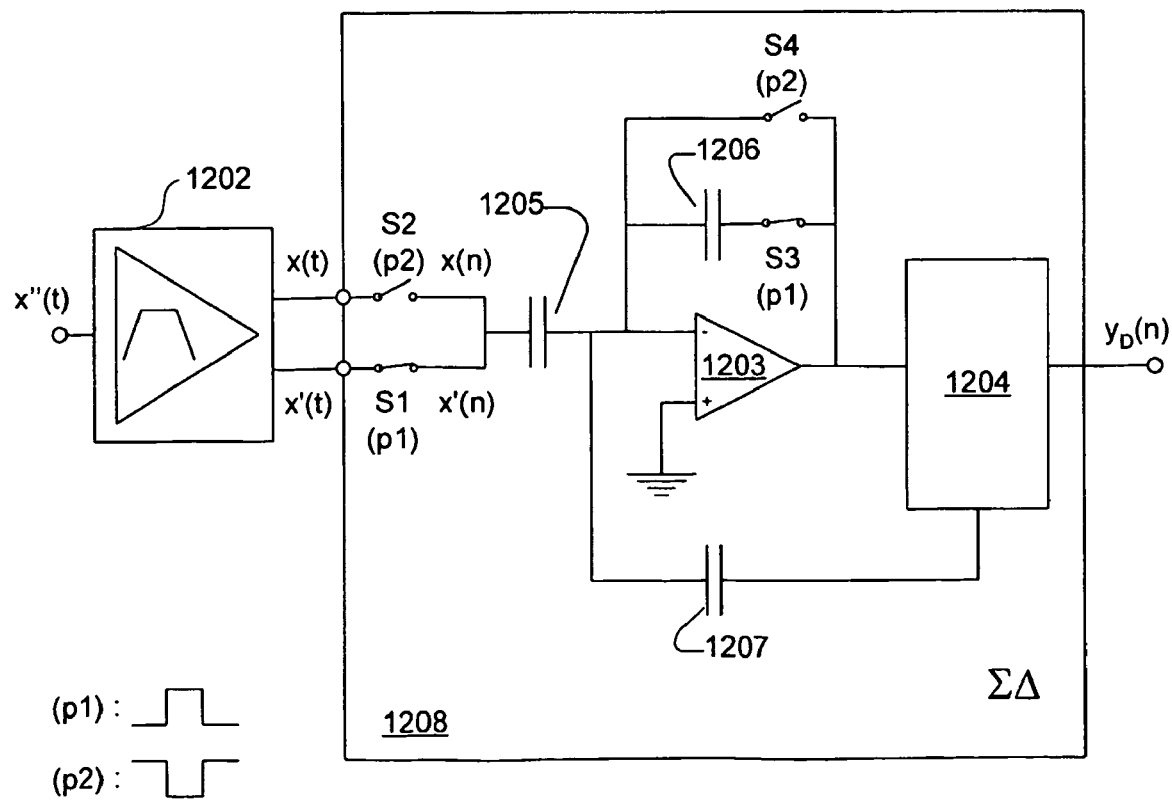
FIG. 12b shows a switch capacitor sampling circuit.

FIG. 12b shows a differential preamplifier followed by a switch-capacitor sampler integrated with a sigma-delta converter. The differential preamplifier 1202 receives an analogue time discrete signal x"(t) e.g. a microphone signal and provides differential outputs x(t) and x'(t). The differential signal provided by the preamplifier is sampled differentially by means of a switch-capacitor detector integrated with the sigma-delta converter. The switch-capacitor detector is built around an operational amplifier 1203. The differential sampling is realized by an input series capacitor 1205 and a feedback capacitor 1206 which are coupled between two circuit configurations by means of switches S1-S4.

The input series capacitor 1205 is, at its input side, connected to the outputs x(t) and x'(t) of the preamplifier 1202 by means of respective switches S1 and S2. The feedback capacitor 1206 is coupled as a feedback path by means of switch S3. The switch S4 is coupled in parallel with the series connection of the capacitor 1206 and the switch S3.

The switches S1-S4 are controlled to be either closed or open according to the scheme shown in the bottom right corner i.e. switches S1 and S3 operate in unison and the switches S2 and S4 operate in unison, but 180 degrees phase shifted relative to S1 and S3. The switches S1-S4 are controlled by means of a clock frequency, e.g. the sampling frequency of the sigma-delta converter. A switch-capacitor sampling of differential signals is known to a person skilled in the art and will not be described in greater detail, but it is shown to illustrate interconnection of the differential preamplifier and the sigma-delta converter.

It should be noted that the amplifier 1301 is coupled by means of capacitor 1303 to realize the summing amplifier of the sigma-delta feedback loop. A person skilled in the art will know how a sigma-delta modulator in general is configured. The skilled person will know that the summing amplifier compares the input signal to a feedback signal obtained from the quantizer that provides the digital output signal $y_D(n)$ Output of the summing amplifier is coupled to an integrator (irrespective of its order) which provides its output signal to the quantizer. The feedback signal is provided to the summing amplifier 1301 by means of the capacitor 1303.

In this illustration an anti-aliasing filter is implemented by means of the upper cut-off frequency implemented by the band-pass filter of the preamplifier. It is required to remove spectral components above a sampling frequency of the converter.

Figure 13:
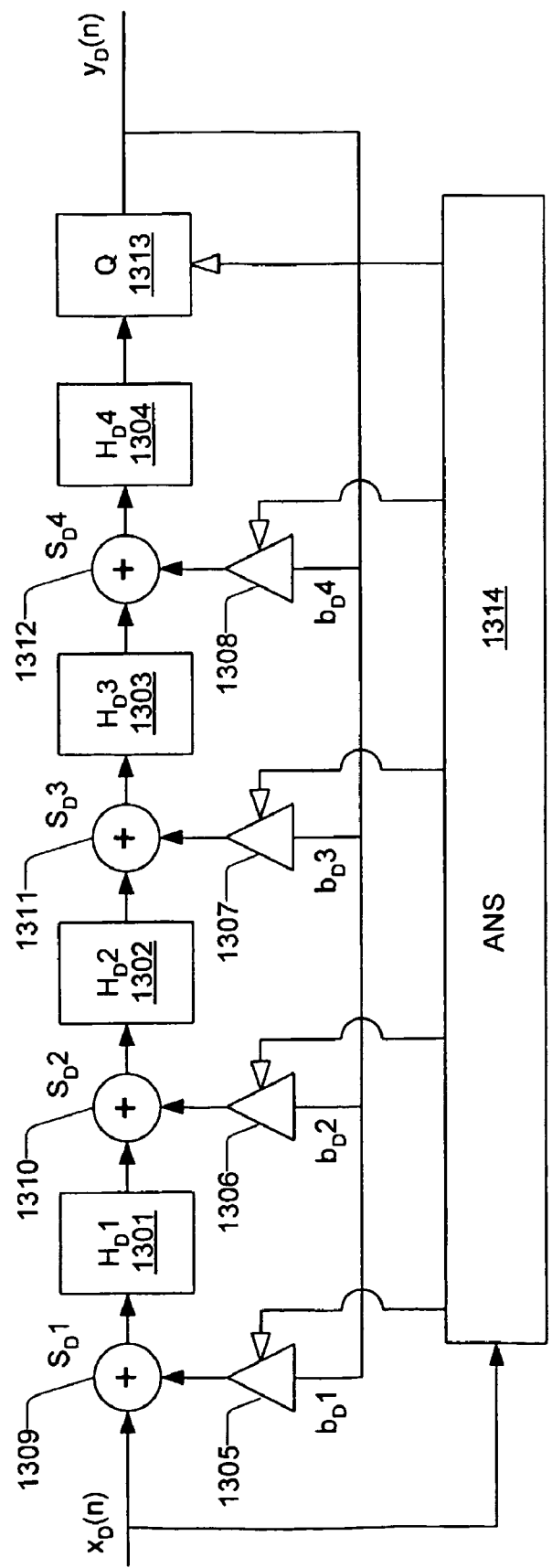
FIG. 13 shows another preferred embodiment of the sigma delta converter, but implemented as a digital modulator.

The Digital Modulator, Preferred Embodiment:

FIG. 13 shows another preferred embodiment of the sigma delta converter, but implemented as a digital modulator. The digital modulator is configured to receive a digital input signal $x_D(n)$ and provide a digital output signal $y_D(n)$.

The integrators of the digital modulator are arranged in a cascaded configuration like the analogue modulator. The digital modulator comprises four digital integrators $H_D1$, 1301; $H_D2$, 1302; $H_D3$, 1303 and $H_D4$, 1304.

Each of the integrators receives an input signal from a respective digital adder $S_D1$, 1309; $S_D2$, 1310; $S_D3$, 1311 and $S_D4$, 1312. The adders receive a first input signal from the output of a preceding digital integrator or, for the first adder in the cascade, from the input $X_D(n)$ of the digital modulator. The adders also receive an input signal form the controllable digital multipliers, which implement controllable coefficients $b_D1$, 1305; $b_D2$, 1306; $b_D3$, 1307 and $b_D4$, 1308 of the digital loop filter. However, since the quantizer Q, 1313 typically is a quantizer with a low number of levels, multiplications of the output (feedback) signal by the multi-bit b-coefficients become expediently simple. This is especially expedient for low power consumption applications. The coefficients $b_D1$, $b_D2$, $b_D3$ and $b_D4$ of the digital loop filter are controlled by filter control signals, FCS, provided by the adaptive noise shaping controller ANS, 1314.

Optionally, the adders can be configured to receive signals provided by fixed or controllable feed-forward coefficients and resonator coefficients. This is described in connection with the analogue implementation of the sigma delta modulator.

Since the input signal is provided in the same domain as the one in which the ANS controller operates, the input signal is selected as adaptation signal.

Further, in general the input signal will be relatively noise-less compared to other types of adaptation signals; therefore low-pass filtering of the adaptation signal can be avoided.

Please note that all the "a" coefficients has been removed to avoid multiplications. The "e" coefficients have been removed because the modulator is of the low-pass type, but the e-coefficients has to be implemented if a band-pass type modulator is to be implemented. Thus, the digital band-pass type modulator is more complex since it involves two additional multipliers.

Figure 14A:
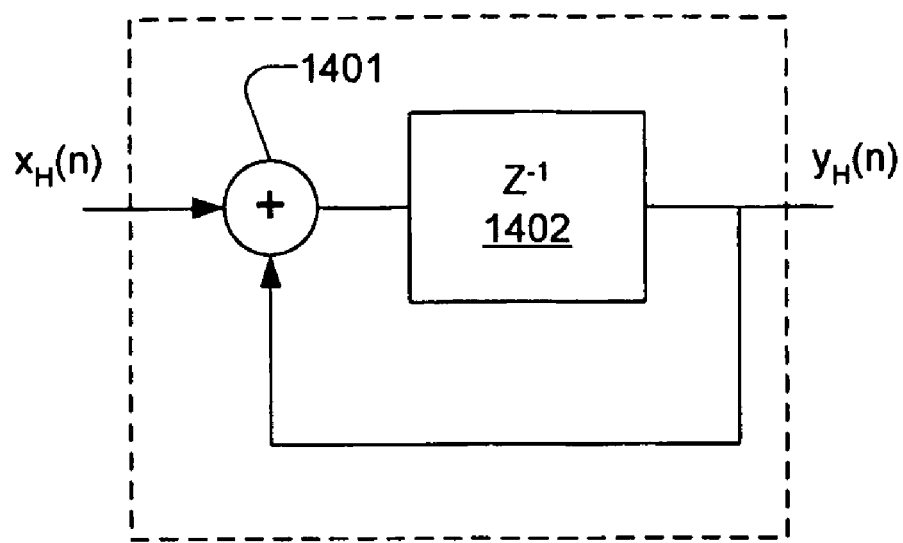
FIGS. 14a and 14b show block diagrams of preferred embodiments of digital integrators.
Figure 14B:
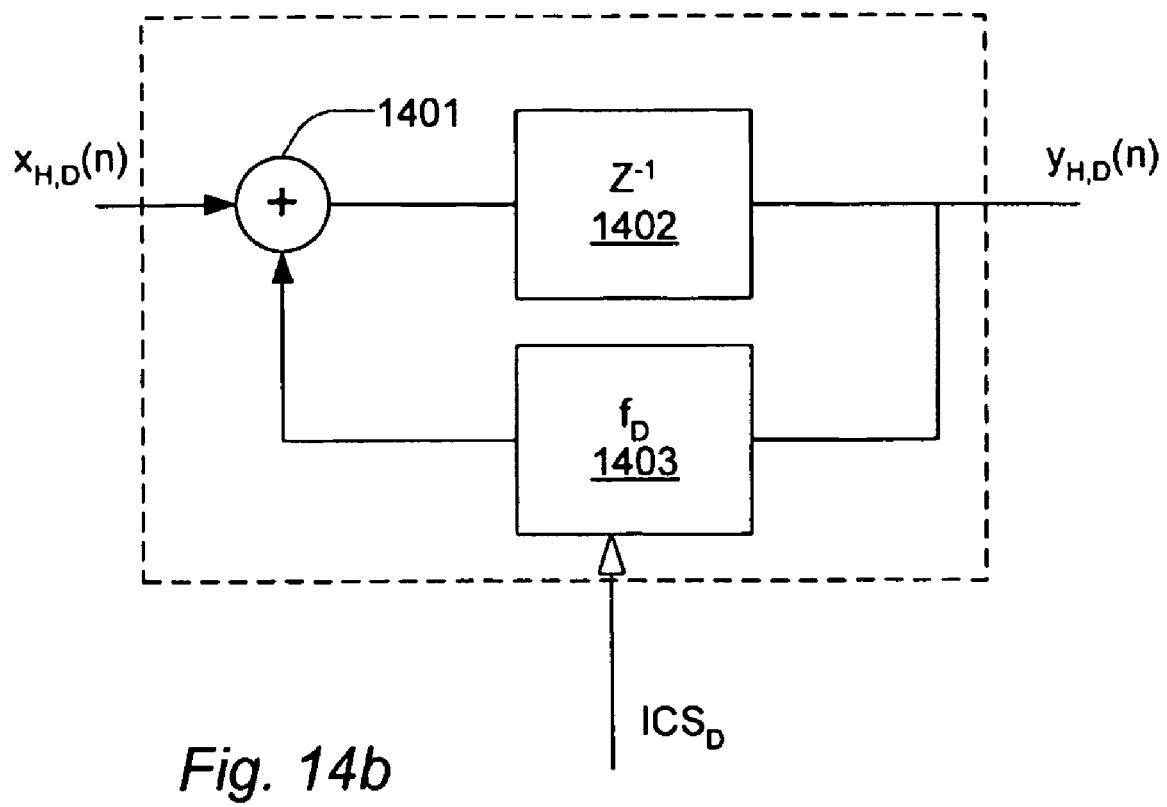

FIGS. 14a and 14b show block diagrams of preferred embodiments of digital integrators.

It is known that the integrators can be implemented as a simple register 1302 which for a given time instance n stores the sum of the input to the integrator at time instance n and a value stored in the register at a previous time instance n−1. The sum is computed by an adder 1301.

The embodiment shown in FIG. 14a provides the output signal $y_H(n)$ as the output of the register 1302. Alternatively, the output signal $y_H(n)$ can be provided directly from the adder 1301 and thus without delay.

FIG. 14b shows a digital integrator with a controllable loss. The loss is implemented by performing simple bit-operations on the signal input to the register 1302. This is implemented by the controllable register 1303 which performs the bit-operations in response to an integrator control signal, ICS, provided by the adaptive noise shaping control circuit, ANS.

The digital integrators with controllable losses are typically limited to specific discrete loss factors $f_D$, which can be implemented by simple bit-operations, when low power consumption is required. These specific discrete loss factors are preferred since multiplications can be computed very simple. The loss factors $f_D$ are restricted to the values: $f_D=\frac{1}{2}n$, where n=0, −1, −2, −3, . . . .

By adding these losses in the integrator, the noise transfer function, NTF is changed and the noise shaping will exhibit lower order noise shaping.

Figure 15:
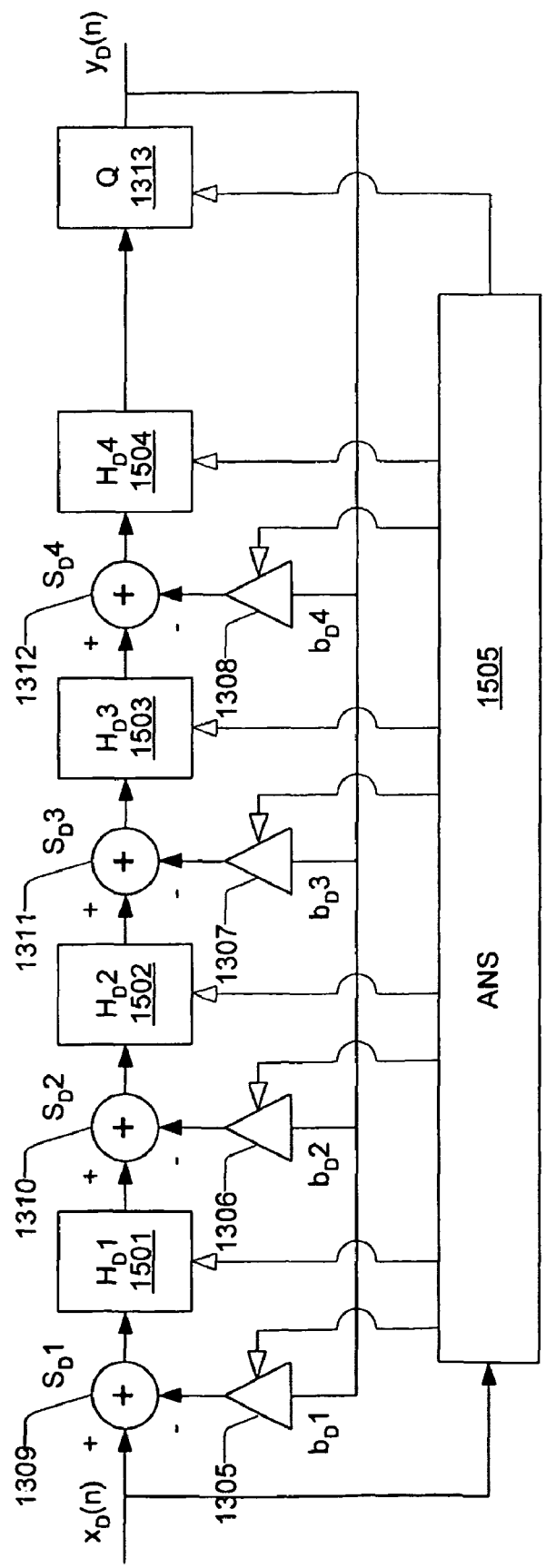
FIG. 15 shows a further preferred embodiment of the sigma delta converter according to the invention when implemented as a digital modulator.

FIG. 15 shows another preferred embodiment of a digital modulator. As for the analogue embodiments, it is possible to add losses to the digital integrators. By adding these losses in the integrators it is possible to shape the noise transfer function, NTF. Thereby it is possible to provide noise shaping which will exhibit lower order noise shaping. When losses are added, the area under the noise transfer function will increase and the maximum stable amplitude, MSA, will increase, all other things being equal. As stated above the losses of the integrators are controlled by an integrator control signal, ICS, provided by the adaptive noise shaping control circuit, ANS, 1505.

The Software Modulator

In this implementation a general purpose CPU (or digital signal processor, DSP) is used to implement the modulator, here the input signal to the modulator would be digital signal. But since a CPU/DSP typical has a built-in multiplier and the power consumption is less restrictive, there will be other priorities than in the digital implementation. Which means the block diagram from the analogue or digital or a mix could be used as a block diagram of the preferred embodiment for this modulator.

In the above, different configurations of preferred embodiments are described. These, and other embodiments, can implement various adaptation strategies in different ways, as described above. In the following different control strategies are described in a frequency-gain domain and an MSA-mx domain.

Figure 16A:
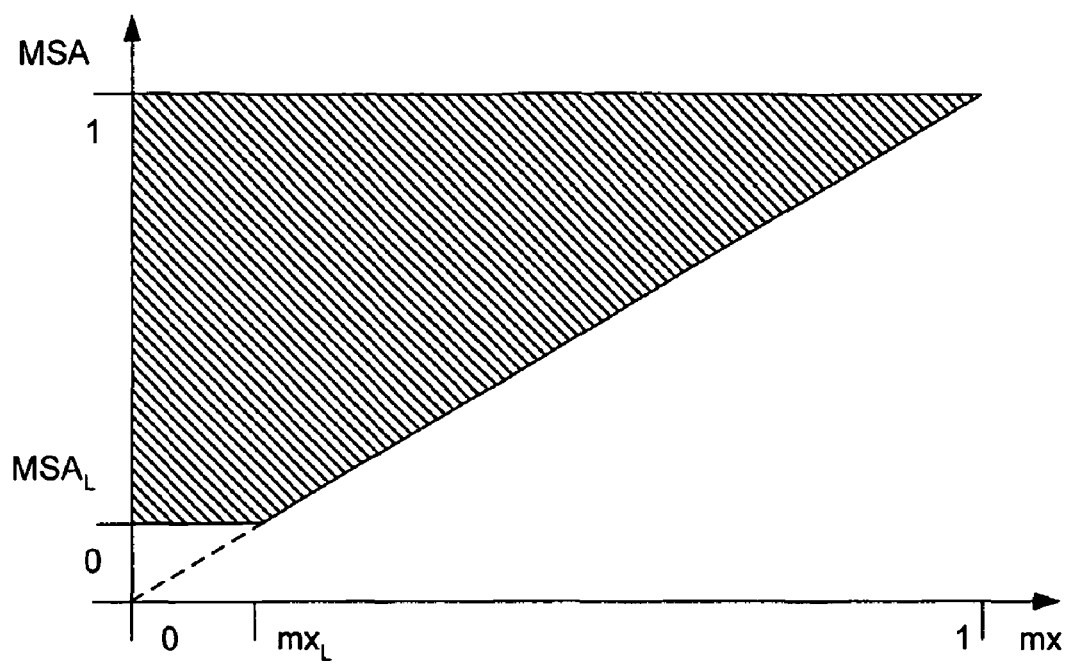
FIG. 16a shows a range of required MSA for a given input signal peak value to provide stable operating conditions.

FIG. 16a shows a range of required MSA for a given input signal peak value to provide stable operating conditions. A plot of an optimum MSA versus the peak value is provided in the form of the straight line. The hatched area represents the range of required MSA for a given input signal peak value to provide stable operating conditions.

Figure 16B:
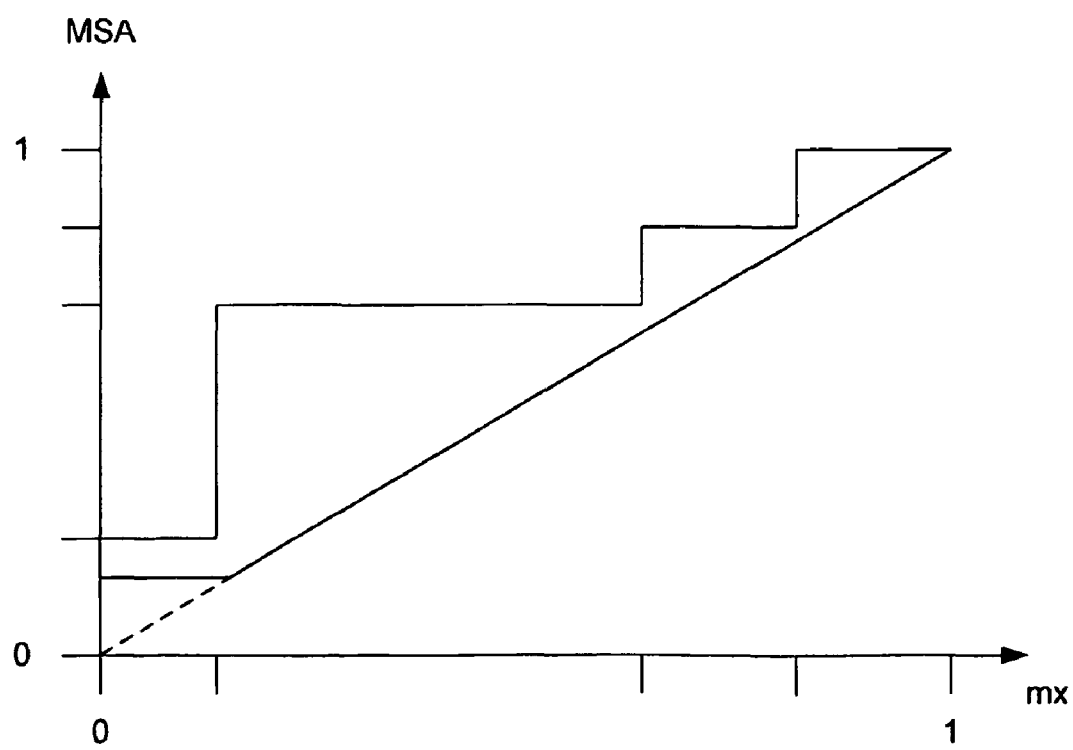
FIG. 16b shows a realized MSA as a function of a input signal peak value, mx, for an exemplary design in which the MSA can be adapted to the peak value by selecting of one of five different noise transfer functions.

FIG. 16b shows a realized MSA as a function of an input signal peak value, mx, for an exemplary design in which the MSA can be adapted to the peak value by selecting of one of five different noise transfer functions. In practical embodiments it is very difficult to control the loop filter H(z) in order to achieve the optimum MSA/mx line in FIG. 16a and a sub-optimum, but a practical solution is shown in FIG. 16b, where the MSA is achieved by adapting to a measured mx value in discrete steps. This means that a final set of loop-filters can be implemented.

Adaptation Strategies

Within the scope of the present invention different strategies for the control of an adaptive noise shaping is available. FIG. 17a through 17d illustrate four different examples of selecting one of three different noise transfer functions in response to a peak value or another signal feature e.g. the signal itself, a low-pass filtered signal or others. Here, only three different noise transfer functions are shown as being selectable; however, within the scope of the invention only two different noise transfer functions or four, five, six or even more noise transfer functions can be selectable. The number of selectable noise transfer functions depends on the one hand on the chip area or computational power available for providing filter coefficients to the loop filter and making a decision on which coefficients, and thus NTF, to select under the adaptive control and, on the other hand, how close to an optimum MSA it is desired to operate the sigma delta modulator. An optimum MSA and a suboptimum MSA are illustrated in FIG. 17b.

Common for FIG. 17a through 17d is that a fixed topology of $4^{th}$ or $3^{rd}$ order has been chosen and that a basic H(z) is with all zeros at DC i.e. the integrator type of modulator. In these examples two features of the NTF are changed:

The high-pass cut-off frequency fo of the NTF;

Some loss is added to the integrator to lower the amplification of H(z) at DC. This gives a less steep amplitude response curve for the NTF characteristic and therefore exhibits a lower order characteristic.

From the below four figures it is clear that the noise shaping of the modulator can be adapted stepwise to an amplitude of the signal feature in the sigma delta modulator.

Figure 17A:
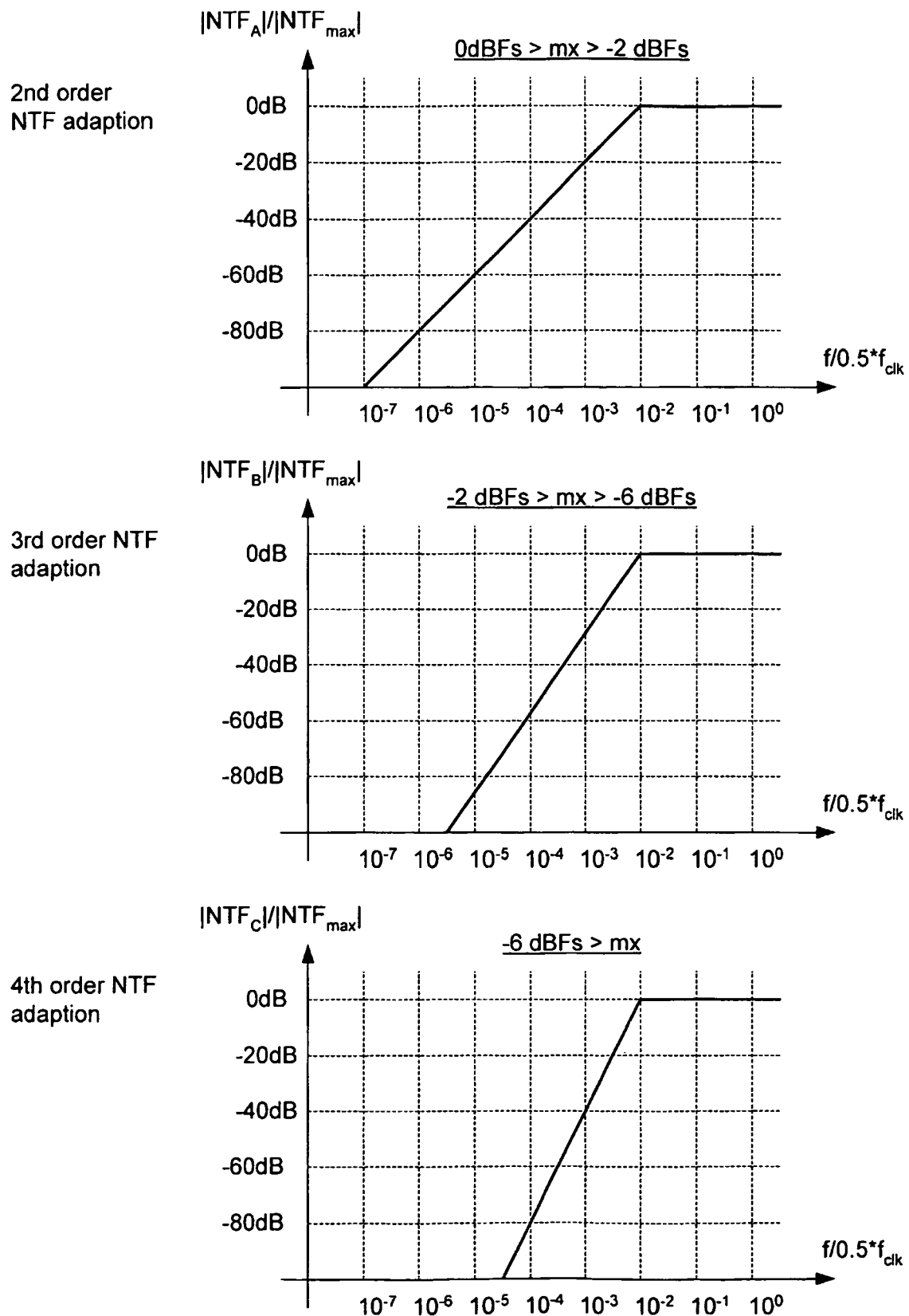
FIG. 17a to 17d show different sets of noise transfer functions that provide different MSA values and different quantization noise attenuation.
Figure 17B:
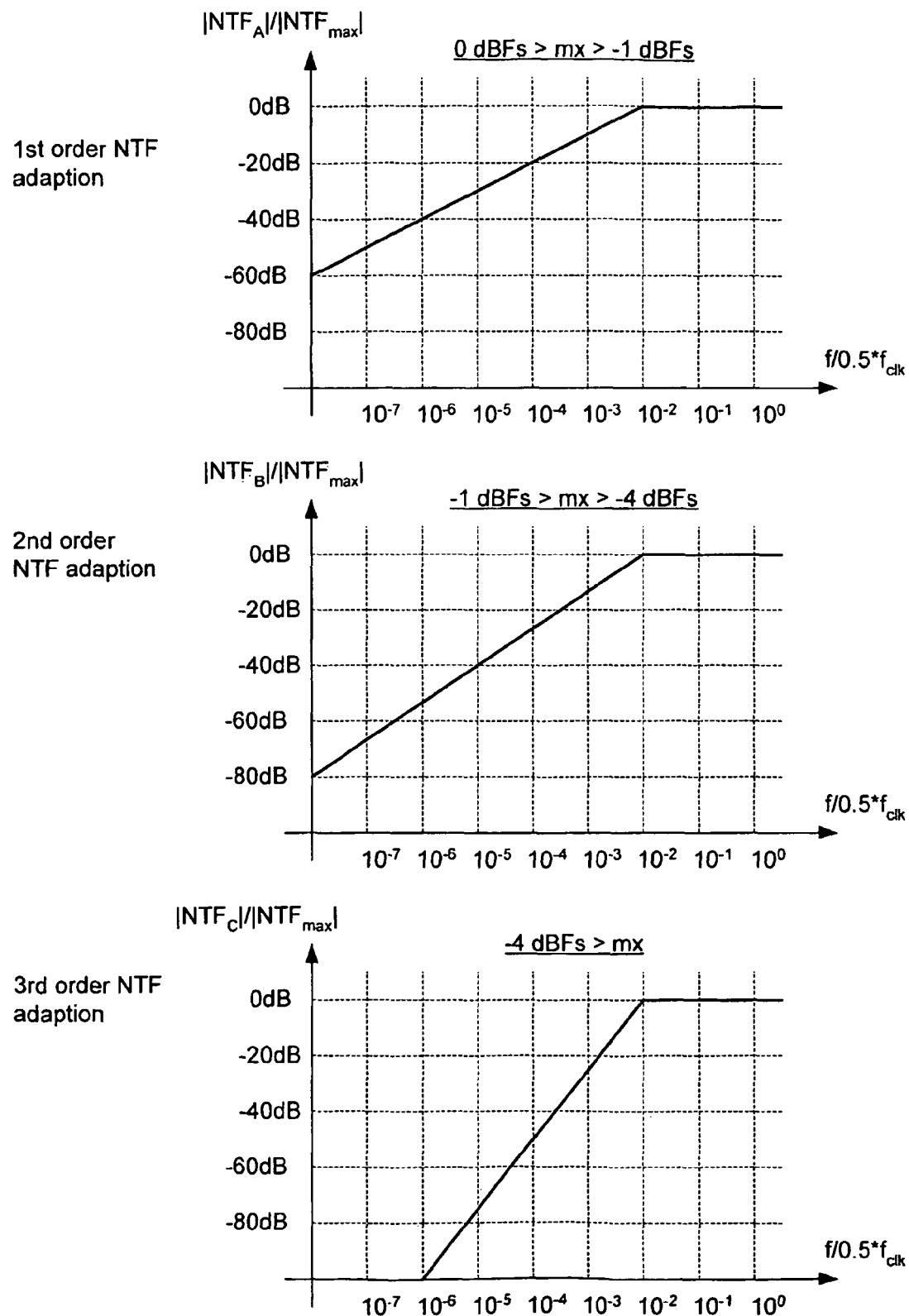

FIG. 17a shows a first set of noise transfer functions that provide different MSA values and different quantization noise attenuation.

The noise transfer functions $NTF_A$, $NTF_B$ and $NTF_C$ are shown as gain-frequency characteristics. The gain characteristics are normalized with respect to a maximum gain $|NTF_{MAX}|$. The frequencies are normalized with respect to half the clock frequency $f_{CLK}$.

The noise transfer function, $NTF_A$, illustrated by curve A is selected for adaptation signal values $m_X$ between 0 dB and -2 dB of full scale. The NTF illustrated by curve B is selected for $m_X$ between -2 dB and -6 dB full scale and the NTF illustrated by curve C is selected for $m_X$ less than -6 dB of full scale.

$NTF_A$ shows a second order transfer function. $NTF_B$ shows a third order transfer function, whereas $NTF_B$ shows a fourth order transfer function.

Thereby the numerical value of the NTF is gradually reduced, quantization noise in a band of interest is gradually attenuated and MSA is gradually lowered.

The band of interest or signal band can be the signal band below normalised frequencies e.g. $1.0*10^{-7}$.

FIG. 17b shows a second set of noise transfer functions that provides different MSA values and different quantization noise attenuation. The noise transfer function, $NTF_A$, illustrated by curve A is selected for adaptation signal values $m_X$ between 0 dB and -1 dB of full scale. The NTF illustrated by curve B is selected for $m_X$ between -1 dB and -4 dB full scale and the NTF illustrated by curve C is selected for $m_X$ less than -4 dB of full scale.

$NTF_A$ shows a first order transfer function. $NTF_B$ shows a second order transfer function, whereas $NTF_B$ shows a third order transfer function. Thereby the numerical value of the NTF is gradually reduced, quantization noise in a band of interest gradually attenuated and MSA gradually lowered.

Figure 17C:
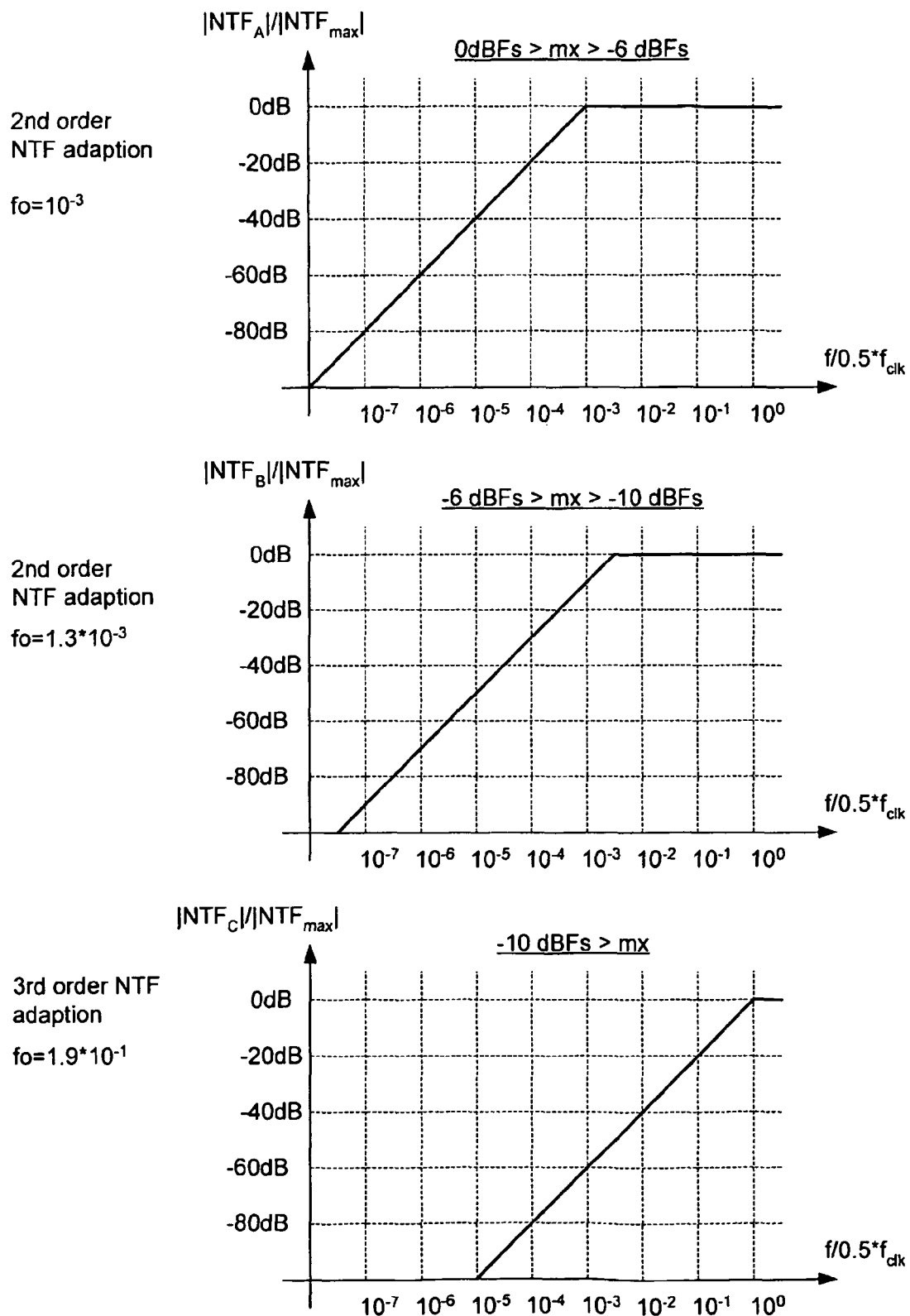

FIG. 17c shows a third set of noise transfer functions that provides different MSA values and different quantization noise attenuation.

The noise transfer function, $NTF_A$, illustrated by curve A, is selected for adaptation signal values $m_X$ between 0 dB and -6 dB of full scale. The NTF illustrated by curve B is selected for $m_X$ between -6 dB and -10 dB full scale and the NTF illustrated by curve C is selected for $m_X$ less than -10 dB of full scale.

$NTF_A$ shows a second order transfer function with a cut-off frequency $f_O=10^{-3}$. $NTF_B$ also shows a second order transfer function, but with a cut-off frequency of $1.3*10^{-3}$, whereas $NTF_C$ shows a third order transfer function with a cut-off frequency $f_O=1.9*10^{-1}$. Thereby the numerical value of the NTF is gradually reduced, quantization noise in a band of interest is gradually attenuated, but MSA is gradually lowered.

Figure 17D:
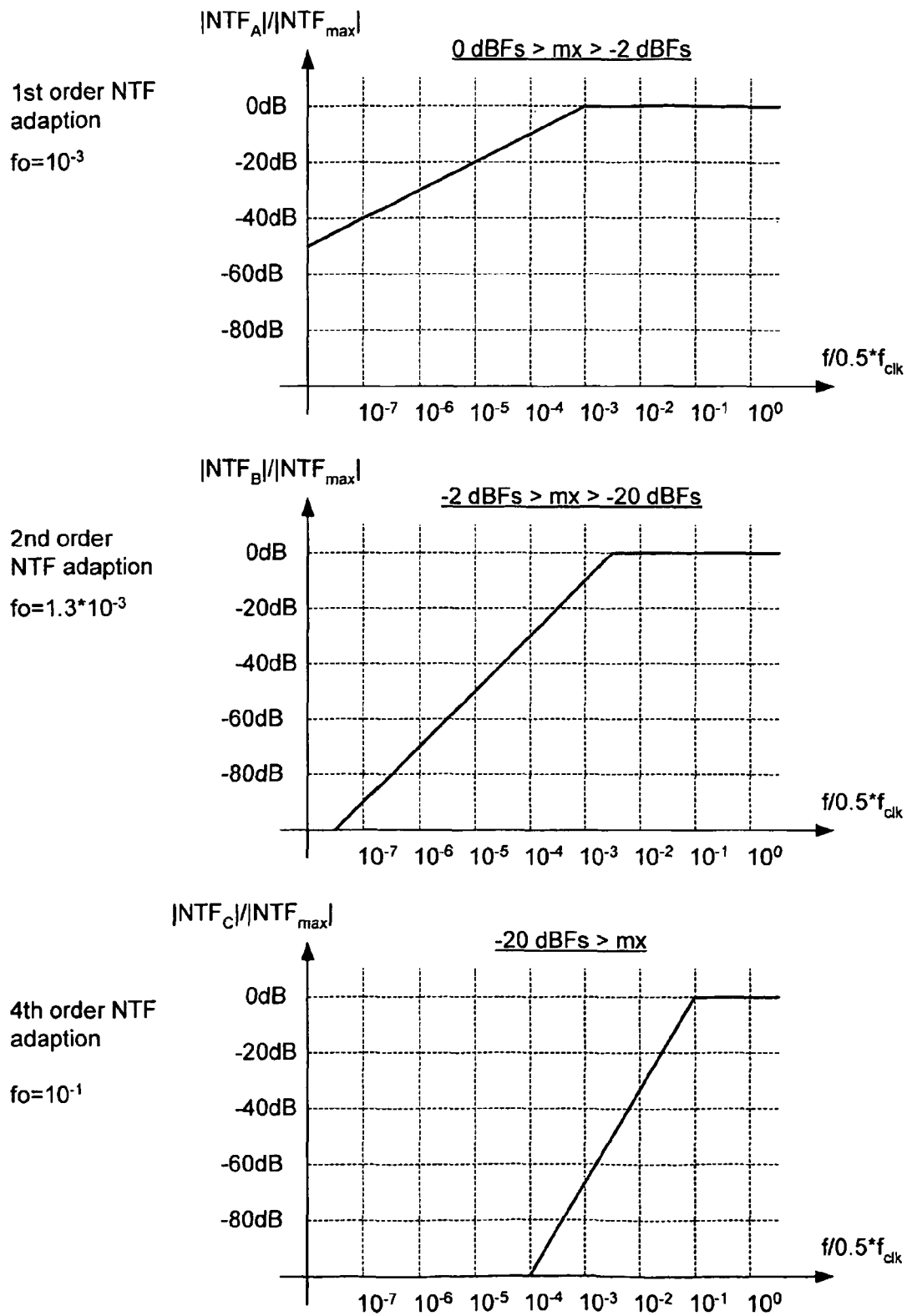

FIG. 17d shows a fourth set of noise transfer functions that provides different MSA values and different quantization noise attenuation.

The noise transfer function, $NTF_A$, illustrated by curve A is selected for adaptation signal values $m_X$ between 0 dB and -2 dB of full scale. The NTF illustrated by curve B is selected for $m_X$ between -2 dB and -20 dB full scale and the NTF illustrated by curve C is selected for $m_X$ less than -20 dB of full scale.

$NTF_A$ shows a first order transfer function with a cut-off frequency $f_O=10^{-3}$. $NTF_B$ also shows a second order transfer function, but with a cut-off frequency of $1.3*10^{-3}$, whereas $NTF_C$ shows a fourth order transfer function with a cut-off frequency $f_O=1.0*10^{-1}$. Thereby the numerical value of the NTF is gradually reduced, quantization noise in a band of interest is gradually attenuated, but MSA is gradually lowered.

Generally, it should be noted that when the adaptive noise shaping is applied to a sigma delta modulator, quantization noise will appear as harmonic signal components in the output spectrum and signal band of interest. However, since the harmonic signal components are limited and defined by the NTF they are very small, note that the NTF typically has more than 50-60 dB attenuation, even at high input levels, in the signal band of interest. This gives harmonics 50-60 dB below the fundamental signal component. The harmonic signal component is especially evident when a large input signal amplitude, which generates full scale output, is applied. However, even at this highest input level the harmonic distortion is measured below 1%. For output levels below −1.5 dB FS the THD is drops to below 0.1%. At lower levels (below −6 dB FS) the harmonic distortions caused by ANS is extremely low and not measurable since the typical NTF would have an attenuation of more than 100 dB. The actual THD depends on the design of the ANS scheme in combination with the sigma delta modulator.

Class-D Amplifier Application

The modulator can also, with great advantage, be used in a Class D amplifier. In recent years Class D amplifiers has become very popular as they have very high power efficiency, are compatible with mainstream inexpensive CMOS technology and can be made with very high performance on a very small silicon die area. The simplest form of a class D amplifier comprises a modulator and a so called H-Bridge.

Figure 18:
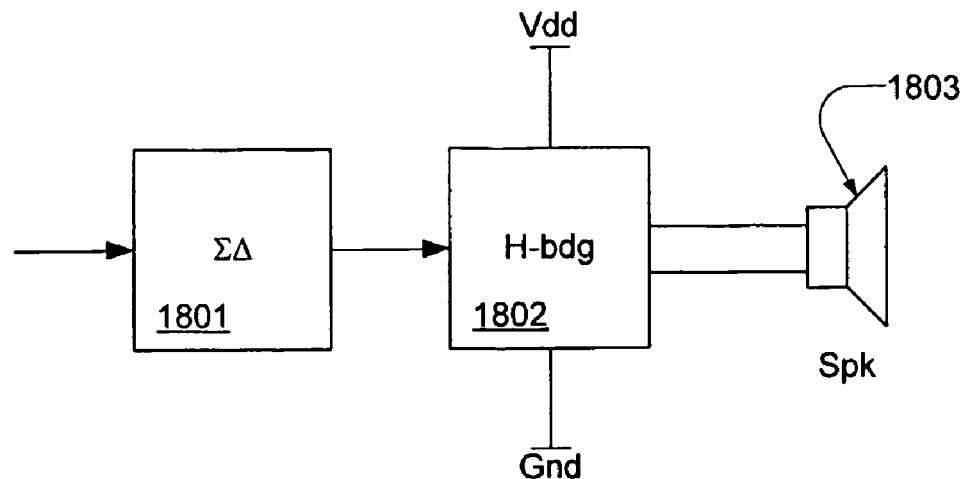
FIG. 18 shows a class-D amplifier comprising a sigma delta modulator and a so-called H-bridge arranged to drive a load.

FIG. 18 shows a class-D amplifier comprising a sigma delta modulator and a H-bridge arranged to drive a load. The class-D amplifier comprises a sigma delta modulator, a H-Bridge and a speaker. A Sigma Delta modulator is used to convert the input signal into a pulse density signal as input for the H-Bridge. Other types of modulators can also be used but here we will focus on sigma delta modulators as they relate directly to the invention. Also we have focused on two level modulators, but it can be extended to higher level modulators e.g. 3, 4 or 5 levels or even more levels.

The function of the H-Bridge is to connect the load, which in this case is a speaker to either VDD-GND or GND-VDD. This represents the two outputs of the Sigma Delta modulator i.e. +1 and −1, in the case of a two level modulator. The load will then be exposed to a wide band signal consisting both of the desired low frequency signal and the high frequency quantization noise. As the speaker itself has a low-pass filter frequency response, it will by itself do the decimation, that is, filter out undesired high-frequency signals. The filter effect of the loudspeaker is generally well-known.

The sigma delta modulator applied in the class-D amplifier is subject to the stability criteria mentioned above. Thus, the amplifier, i.e. the modulator is to be operated to adapt its MSA by selecting an appropriate loop filter characteristic to obtain a maximum suppression of quantization noise for a measured input signal amplitude.

To obtain the largest possible dynamic range the MSA should normally be designed for approx 0.5. This has the consequence that the maximum output signal is 6 dB lower than what can be achieved if the MSA was equal to one. Or one is forced to increase the noise to unacceptable levels in order to increase the MSA. This is the reason why the use of sigma delta modulators has not become so popular for Class D amplifiers, despite the fact that they are very simple to implement. These shortcomings related to class-D amplifiers are overcome by the present invention.

The invention allows an optimization of the adaptive behaviour under which a relatively aggressive suppression of the quantization noise is applied when relatively low signal amplitudes are detected, whereas when relatively high signal amplitudes are detected, a less aggressive suppression of the quantization noise is applied.

In class-D amplifiers for audio use the invention is especially advantageous as the ear is very sensitive to noise at low signal levels, whereas the ear will be less sensitive to noise at high signal levels. This property is referred to as masking i.e. a relatively high-level audio signal will mask noise such that a present relatively high noise level is not perceived to be as dominantly as it would be for relatively low-level audio signals.

Figure 19:
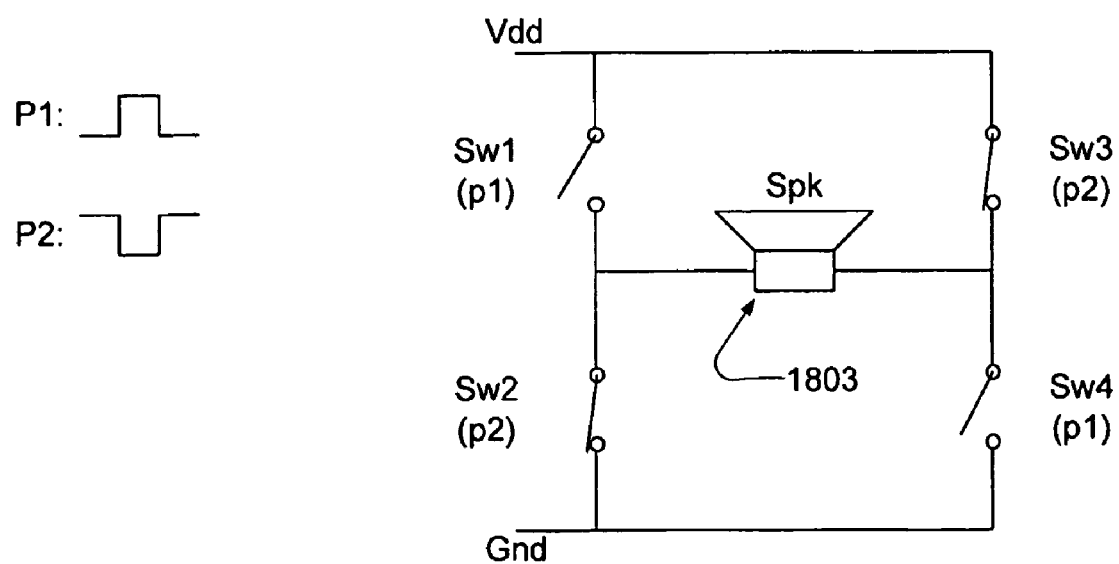
FIG. 19 shows a configuration of an H-bridge.

FIG. 19 shows a configuration of an H-bridge. An H-Bridge in its simplest form comprises four switches in the figure denoted Sw1-P1 to Sw4-p1. Two of them connected to VDD (Sw1-p1 and Sw3-p2) and two connected to GND (Sw2-p2 and Sw4-p1).

By controlling these switches the output load, which can be a speaker, can be connected to VDD at one of its two terminals and GND at the other thereby generating a voltage corresponding to a logic +1. In the same way a −1 can be generated, i.e. +1*Vdd and −1*Vdd.

Control signals for generating a series of −1, +1, −1 is shown as P1 and P2, i.e. the signal P1 controls switches Sw1-p1 and Sw4-p1 and P2 controls the switches Sw2-p2 and Sw4p1.

The H-Bridge can easily be extended to three levels. By connecting both sides of the speaker to either GND or VDD a zero can be generated. A control circuit for the switches are trivial to implement and will not be shown here.

Microphone Application

Figure 20:
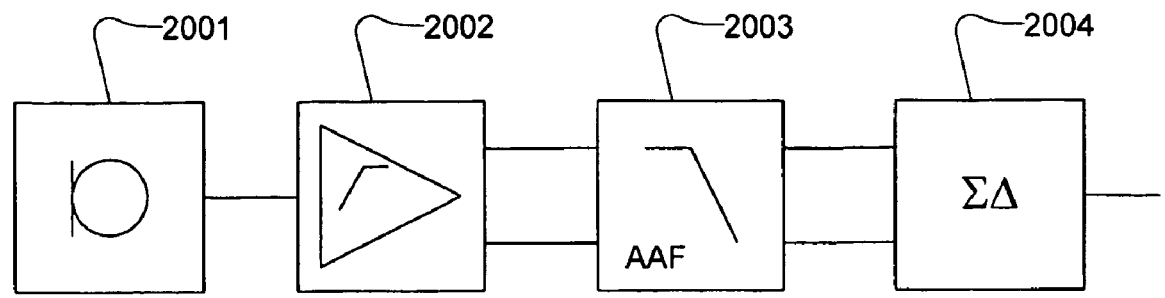
FIG. 20 shows a first block diagram of a digital microphone.

FIG. 20 shows a block diagram of a digital microphone. The digital microphone comprises a microphone element 2001 in the form of a condenser microphone, electret condenser microphone or MEMS microphone. The microphone element provides a microphone signal in response to a sound pressure on the microphone element. The microphone signal is high-pass filtered by means of an integrated high-pass filter and preamplifier 2002. Subsequently, the high-pass filtered microphone signal is anti-aliasing filtered by anti-aliasing filter 2003. The anti-aliasing filtered microphone signal is subsequently provided to the sigma delta modulator 2004 as disclosed above. Thereby a digital microphone signal is provided.

When the sigma delta modulator samples the anti-aliasing filtered microphone signal with a high over-sampling ratio of e.g. OSR=50 times a simple RC anti-aliasing filter can be used.

The combined pre-amplifier and high-pass filter 2002 performs a high-pass filtering of the microphone signal with a filter with a very low cut-off frequency e.g. about 2-10 Hz. Thereby low-frequent noise picked up by the microphone element is removed to improve the subsequent signal processing. The preamplifier provides a differential output signal to the anti-aliasing filter and the sigma delta modulator to improve performance, but a single ended signal processing can be applied as well. This configuration is described in detail in the co-pending application PCT/DK2004/000707.

It should be noted that the high-pass filter and preamplifier can be implemented as detached signal processing circuits.

Figure 21:
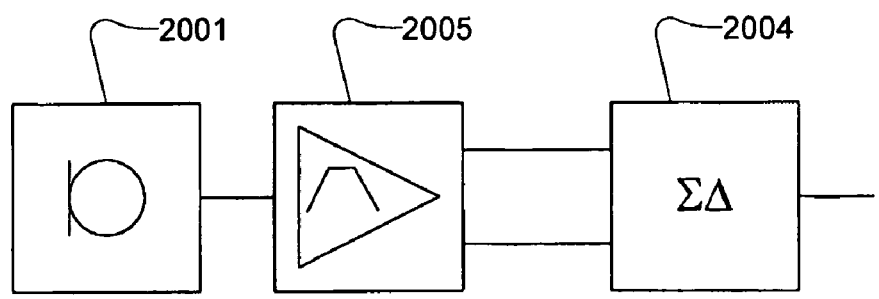
FIG. 21 shows a second block diagram of a digital microphone.

FIG. 21 shows another block diagram of a digital microphone. In this embodiment a band-pass filter 2005 performs the pre-amplification of the microphone signal from the microphone element, high-pass filtering and anti-aliasing filtering. This configuration is described in detail in the co-pending application PCT/DK2005/000086.

Figure 22:
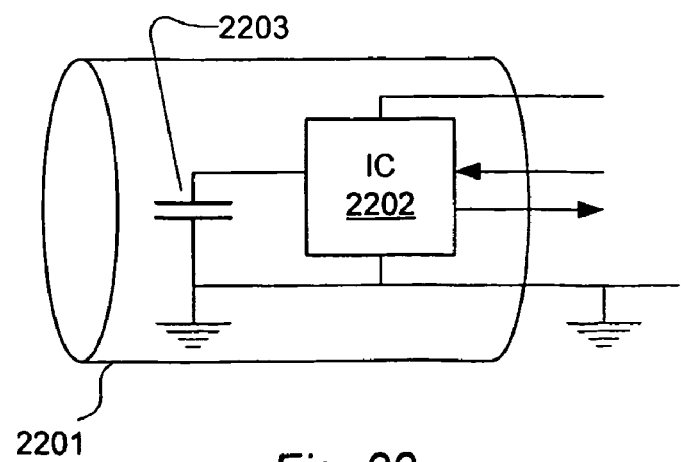
FIG. 22 shows a schematic view of a microphone with an integrated circuit and a microphone member.

FIG. 22 is a schematic view of a microphone with an integrated circuit and a microphone member. The microphone is shown as a cartridge 2201 with a microphone element 2203 and an integrated circuit 2202.

Generally, it should also be noted that various implementations of the sigma delta modulator are possible comprising e.g. RC implementations.

The invention claimed is:

1. A method of controlling a sigma delta modulator with a loop which establishes a signal transfer function and a noise transfer function of the sigma delta modulator, wherein the sigma delta modulator receives an input signal and provides a modulated output signal in response to the input signal;

wherein the noise transfer function establishes a maximum stable amplitude for the input signal;

wherein the sigma-delta modulator comprises a loop filter and operates at a clock frequency that sets an oversampling ratio;

the method controlling the sigma delta modulator to change the noise transfer function in response to an output signal of the modulator or a state variable of the loop filter, and comprising steps of:

processing the output signal of the modulator or a state variable of the loop filter with a peak detector to determine a peak detector output, storing a running window of N previous samples of the peak detector output, where N is less than the oversampling ratio, selecting a maximum of the N previous samples to provide an intermediate control signal, deriving the control signals for controlling the noise transfer function from the intermediate control signal such that the noise transfer function is changed to suppress quantization noise to a smaller extent when the output signal of the modulator or a state variable of the loop filter represents a relatively large amplitude, whereas when the output signal of the modulator or a state variable of the loop filter represents a relatively small amplitude, the noise transfer function is changed to suppress quantization noise to a larger extent.

2. The method according to claim 1, where the noise transfer function is changed while the sigma delta modulator operates in a stable state.

3. The method according to claim 1, where the loop filter comprises a cascade of more than two integrators.

4. The method according to claim 3, where the shaping of the noise transfer function is controlled by changing loss-coefficients of the more than two integrators of the cascade of more than two integrators.

5. The method according to claim 4, where the loss-coefficients of the more than two integrators of the cascade of more than two integrators are controllably adjustable between a lower value larger than the value zero and an upper value lower than or equal to one.

6. The method according to claim 1, where shaping of the noise transfer function is controlled by changing filter coefficients of the loop filter to move zeroes or poles in the transfer function provided by the loop filter.

7. The method according to claim 1, where the loop of the sigma delta converter comprises a quantizer which quantizes an input to the quantizer in $N_Q$ levels, where $N_Q$ is larger than or equal to two levels, but less than six levels.

8. The method according to claim 1, where the loop of the sigma delta converter comprises a quantizer, and where shaping of the noise transfer function is controlled by changing thresholds of a quantizer of the loop.

9. The method according to claim 1, where the input signal is provided via a pre-filter which is controlled for selected values of the output signal of the modulator or a state variable of the loop filter.

10. The method according to claim 9, wherein a decision on which control signals to provide for control of the noise transfer function is performed by a lookup table which comprises stored control signals and associated with values or ranges of values of the intermediate control signal.

11. The method according to claim 10, wherein noise transfer functions which provide a maximum stable amplitude, MSA, located at least 5% above an estimated peak value are selected.

12. The method according to claim 1, comprising the step of:

computing connected values of threshold peak values and selectable loop filter parameters, which are connected in the sense that for a given value of the output signal of the modulator or the state variable of the loop filter, a nearest lower threshold peak value determines the threshold at which selectable loop filter parameters, when applied to the loop filter, provide a modulator which is stable for values of the output signal of the modulator or the state variable of the loop filter.

13. The method according to claim 1, wherein the peak detector performs low-pass filtering of the output signal of the modulator or the state variable of the loop filter and subsequently determines a numerical value of the low-pass filtered output signal of the modulator or the state variable of the loop filter.

14. The method according to claim 1, wherein a full-scale range of peak values of the output signal of the modulator or the state variable of the loop filter is divided into a number of ranges, where each range is associated with a selectable noise transfer function.

15. The method according to claim 1, comprising the steps of determining:

minimum values of a noise amplification factor for different loop filters;

a maximum stable amplitude value, MSA, which is selected such that input signal values less than MSA will provide a stable modulator;

creating a bank of different loop filters wherein each loop filter is related to a respectively determined maximum stable amplitude value MSA; and selecting a loop filter from the bank in response to the output signal of the modulator or the state variable of the loop filter.

16. A sigma delta modulator with a loop which establishes a signal transfer function and a quantization noise transfer function of the sigma delta modulator, where the sigma delta modulator receives an input signal, x(n), and provides a modulated output signal, y(n) in response to the input signal;

wherein the noise transfer function establishes a maximum stable amplitude for the input signal;

wherein the sigma-delta modulator comprises a loop filter and operates at a clock frequency that sets an oversampling ratio;

wherein the sigma delta modulator is configured to:

change the quantization noise transfer function, NTF, in response to an output signal of the modulator or a state variable of the loop filter, process the output signal of the modulator or a state variable of the loop filter with a peak detector to determine a peak detector output, store a running window of N previous samples of the peak detector output, where N is less than the oversampling ratio, select a maximum of the N previous samples to provide an intermediate control signal, and derive the control signals for controlling the noise transfer function from the intermediate control signal such that the noise transfer function is changed to suppress quantization noise to a smaller extent when the output signal of the modulator or a state variable of the loop filter represents a relatively large amplitude, whereas when the output signal of the modulator or a state variable of the loop filter represents a relatively small amplitude, the noise transfer function is changed to suppress quantization noise to a larger extent.

17. The sigma delta modulator according to claim 16, where the noise transfer function, NTF, is changed while the sigma delta modulator operates in a stable state.

18. The sigma delta modulator according to claim 16, where the loop filter comprises a cascade of more than two integrators.

19. The sigma delta modulator according to claim 16, where shaping of the noise transfer function is controlled by changing filter coefficients of the loop filter to move zeroes or poles in the transfer function provided by the loop filter.

20. The sigma delta modulator according to claim 16, where the loop filter comprises a cascade of integrator stages, and where shaping of the noise transfer function is controlled by changing loss-coefficients of the integrators.

21. The sigma delta modulator according to claim 20, where the loss-coefficients of the integrators of the cascade of integrator stages are controllably adjustable between a lower value larger than the value zero and an upper value lower than or equal to one.

22. The sigma delta modulator according to claim 16, where the loop of the sigma delta modulator comprises a quantizer which quantizes an input to the quantizer in $N_Q$ levels, where $N_Q$ is larger than or equal to two levels, but less than six levels.

23. The sigma delta modulator according to claim 16, where the loop of the sigma delta modulator comprises a quantizer, and where shaping of the noise transfer function is controlled by changing thresholds of a quantizer of the loop.

24. The sigma delta modulator according to claim 16, where the input signal is provided via a pre-filter which is controlled for selected values of the output signal of the modulator or the state variable of the loop filter.

25. The sigma delta modulator according to claim 16, where the sigma delta modulator is configured to compute coexisting values of amplitude ranges, MSA, and loop filter parameters, which are coexisting in the sense that for a given value of an amplitude range, the coexisting loop filter parameters, when applied to shape the loop filter, provide a modulator which is stable for signal amplitudes smaller than the given value of an amplitude range.

26. The sigma delta modulator according to claim 25, wherein the peak detector performs low-pass filtering of the output signal of the modulator or the state variable of the loop filter and subsequently determines the numerical value of the low-pass filtered output signal of the modulator or the state variable of the loop filter.

27. The sigma delta modulator according to claim 16, wherein the decision on which of the control signals to provide for control of the noise transfer function is performed by a lookup table which comprises stored control signals and associated with values or ranges of values of the intermediate control signal.

28. The sigma delta modulator according to claim 16, wherein noise transfer functions which provide a maximum stable amplitude, MSA, located at least 5% above an estimated peak value are selected.

29. The sigma delta modulator according to claim 16, wherein a full-scale range of peak values of the output signal of the modulator or the state variable of the loop filter is divided into a number of ranges, where each range is associated with a selectable noise transfer function.

30. An analogue to digital converter comprising a sigma delta modulator according to claim 16.

31. A digital to analogue converter comprising a sigma delta modulator according to claim 16.

32. A microphone comprising a preamplifier and a sigma delta modulator according to claim 16.

33. A class-D amplifier comprising a sigma delta modulator according to claim 16.

* * * * *